United States Patent [19]
Chilton et al.

[11] Patent Number: 5,822,564
[45] Date of Patent: Oct. 13, 1998

[54] CHECKPOINTING IN AN EMULATION SYSTEM

[75] Inventors: John Chilton, Soquel; Tony Sarno, Scotts Valley; Ingo Schaefer, Sunnyvale, all of Calif.

[73] Assignee: Quickturn Design Systems, Inc., Mountain View, Calif.

[21] Appl. No.: 672,762

[22] Filed: Jun. 28, 1996

Related U.S. Application Data

[60] Provisional application No. 60/019,078 Jun. 3, 1996.

[51] Int. Cl.[6] .......................... G06F 9/455; G06F 17/50
[52] U.S. Cl. .......................................................... 395/500
[58] Field of Search ................................. 364/488–491, 364/578; 395/500

[56] References Cited

U.S. PATENT DOCUMENTS

| | | | |
|---|---|---|---|
| 3,955,180 | 5/1976 | Hirtle | 340/172.5 |
| 4,306,286 | 12/1981 | Cocke et al. | |
| 4,357,678 | 11/1982 | Davis . | |
| 4,527,249 | 7/1985 | Van Brunt | 364/578 |
| 4,583,169 | 4/1986 | Cooledge . | |
| 4,587,625 | 5/1986 | Marino et al. | 364/578 |
| 4,656,580 | 4/1987 | Hitchcock, Sr. et al. . | |
| 4,695,968 | 9/1987 | Sullivan, II et al. . | |
| 4,697,241 | 9/1987 | Lavi | 364/488 |
| 4,725,971 | 2/1988 | Doshi et al. | 364/578 |
| 4,769,817 | 9/1988 | Krohn et al. | 371/23 |
| 4,782,461 | 11/1988 | Mick et al. . | |
| 4,787,061 | 11/1988 | Nei et al. . | |
| 4,787,062 | 11/1988 | Nei et al. . | |
| 4,819,150 | 4/1989 | Jennings et al. . | |
| 4,862,347 | 8/1989 | Rudy . | |
| 4,879,646 | 11/1989 | Iwasaki et al. . | |
| 4,914,612 | 4/1990 | Beece et al. | 364/578 |
| 4,972,334 | 11/1990 | Yamabe et al. | 364/200 |
| 5,031,129 | 7/1991 | Powell et al. | 364/717 |
| 5,036,473 | 7/1991 | Butts et al. | 364/488 |
| 5,068,812 | 11/1991 | Schaefer et al. | 364/578 |
| 5,084,824 | 1/1992 | Lam et al. | 364/490 |
| 5,088,033 | 2/1992 | Binkley et al. | 395/500 |
| 5,109,353 | 4/1992 | Sample et al. | 364/578 |
| 5,114,353 | 5/1992 | Sample et al. | 439/65 |
| 5,126,966 | 6/1992 | Hafeman et al. | 364/500 |
| 5,259,006 | 11/1993 | Price et al. | 375/107 |
| 5,321,828 | 6/1994 | Phillips et al. | 395/500 |
| 5,329,470 | 7/1994 | Sample et al. | 364/578 |

(List continued on next page.)

OTHER PUBLICATIONS

Goering, R., "Emulation for the Masses", Electronic Engineering Times, Jan. 29, 1996, p. 63.

Sim Express TM "Hardware Emulator", Virtual Machine Works pp. 1–24.

Maliniak, L., "Pin Multiplexing Yields Low–Cost Logic Emulation", Electronic Design, Jan. 22, 1996.

Agarwal, Anant, "Virtual Wires TM A Technology for Massive Multi–FPGA Systems", Vistual Machine Works (no publication date given).

"Virtual Wires Published Papers," Various Dates.

"VHDL Mixed–Level Fault Simulator", N/A.

VirtuaLogic SLI Emulation System, "VirtuaLogic SLI", N/A.

"Logic Emulation for the Masses Arrives", N/A.

"Ikos Systems to Acquire Virtual Machine Works", N/A, Mar. 26, 1997, pp. 1 & 2.

*Primary Examiner*—Kevin J. Teska
*Assistant Examiner*—Ayni Mohamed
*Attorney, Agent, or Firm*—Lyon & Lyon LLP

[57] ABSTRACT

A method and apparatus for outputting a current state of a real-time circuit emulator. When the emulator is set to a predetermined state, it checkpoints the contents of certain memory and registers at the time it enters the predetermined state. The output of the emulator can be used as input to the emulator or as input to another system, such as a simulator, which does not operate in real-time. If the simulator also generates an output having same format, the output of the simulator can also be input to the real-time emulator.

2 Claims, 46 Drawing Sheets

U.S. PATENT DOCUMENTS

| | | | |
|---|---|---|---|
| 5,329,471 | 7/1994 | Swoboda et al. | 364/578 |
| 5,331,571 | 7/1994 | Aronoff et al. | 364/490 |
| 5,345,580 | 9/1994 | Tamaru et al. | 395/500 |
| 5,352,123 | 10/1994 | Sample et al. | 439/61 |
| 5,377,123 | 12/1994 | Hyman | 364/489 |
| 5,386,550 | 1/1995 | Yumioka et al. | 395/575 |
| 5,396,498 | 3/1995 | Lestral et al. | 371/371 |
| 5,425,036 | 6/1995 | Liu et al. | 371/23 |
| 5,437,037 | 7/1995 | Furuichi | 395/700 |
| 5,448,496 | 9/1995 | Butts et al. | 364/488 |
| 5,448,522 | 9/1995 | Huang | 365/189 |
| 5,452,231 | 9/1995 | Butts et al. | 364/489 |
| 5,452,239 | 9/1995 | Dai et al. | 364/578 |
| 5,475,624 | 12/1995 | West | 364/578 |
| 5,475,830 | 12/1995 | Chen et al. | 395/364 |
| 5,477,475 | 12/1995 | Sample et al. | 364/578 |
| 5,551,013 | 8/1996 | Beausoliel et al. | 395/500 |
| 5,572,710 | 11/1996 | Asano et al. | 395/500 |
| 5,621,651 | 4/1997 | Swoboda | 364/489 |

LOGIC PROCESSOR I/O DEPENDENCIES:

| LOGIC PROC | INPUT VALUE | EARLIEST TIME AVAILABLE (USED) | OUTPUT VALUE | LATEST TIME REQUIRED (GENERATED) |
|---|---|---|---|---|
| A | Q0 (STORED) | 0 | Q0 | (NEXT PROGRAM CYCLE) |
|   | CLEAR | 2 | | |
|   | CLOCK_POSEDGE | 2 | | |
| B | Q0 (STORED) | 0 | Q1 | (NEXT PROGRAM CYCLE) |
|   | Q1 (STORED) | 0 | | |
|   | CLEAR | 2 | | |
|   | CLOCK_POSEDGE | 2 | | |
| C | Q0 (STORED) | 0 | Q2 | (NEXT PROGRAM CYCLE) |
|   | Q1 (STORED) | 0 | | |
|   | Q2 (STORED) | 0 | | |
|   | CLEAR | 2 | | |
|   | CLOCK_POSEDGE | 2 | | |
| D | Q0 (STORED) | 0 | Q3 | (NEXT PROGRAM CYCLE) |
|   | Q1 (STORED) | 0 | | |
|   | Q2 (STORED) | 0 | | |
|   | Q3 (STORED) | 0 | | |
|   | CLEAR | 2 | | |
|   | CLOCK_POSEDGE | 2 | | |
| E | Q0 (STORED) | 0 | CLEAR | (BEFORE A, B, C & D) |
|   | Q1 (STORED) | 0 | | |
|   | Q2 (STORED) | 0 | | |
|   | Q3 (STORED) | 0 | | |
|   | C0 (INPUT) | 1 | | |
|   | C1 (INPUT) | 1 | | |
|   | C2 (INPUT) | 1 | | |
|   | C3 (INPUT) | 1 | | |
|   | RESET (INPUT) | 1 | | |
| F | CLOCK (INPUT) | 1 | CLOCK_DELAYED | (NEXT PROGRAM CYCLE) |
| G | CLOCK_DELAYED (STORED) | 0 | CLOCK_POSEDGE | (BEFORE A, B, C & D) |
|   | CLOCK | 1 | | |

FIG. 12

ASSIGNMENT OF LOGIC PROCESSORS TO EMULATOR RESOURCES:

| OUTPUT VALUE | LOGIC PROC | TIME SLICE | LOGIC UNIT | LOGIC OUTPUT | LOGIC BUS WIRE |
|---|---|---|---|---|---|
| Q0 | A | 2 | 0 | 3 | 355 |
| Q1 | B | 2 | 0 | 2 | 354 |
| Q2 | C | 2 | 0 | 1 | 353 |
| Q3 | D | 2 | 0 | 0 | 352 |
| CLEAR | E | 1 | 0 | 0 | 352 |
| CLOCK_DELAYED | F | 1 | 0 | 2 | 354 |
| CLOCK_POSEDGE | G | 1 | 0 | 1 | 353 |

FIG. 13

ASSIGNMENT OF PRIMARY INPUTS TO LOGIC BUS LOCATIONS:

| INPUT VALUE | TIME SLICE | LOGIC BUS WIRE |
|---|---|---|
| C0 | 0 | 352 |
| C1 | 0 | 353 |
| C2 | 0 | 354 |
| C3 | 0 | 355 |
| RESET | 0 | 356 |
| CLOCK | 0 | 357 |

FIG. 14

1K:1 MUX SETTINGS FOR TIME 1 LOGIC UNIT 0.

| INPUT INDEX | SELECT VALUE | SHIFT REGISTER INDEX | SHIFT REGISTER DELAY | TIME GENERATED |
|---|---|---|---|---|
| 0 | 508 | 7 | 4 | 1 |
| 1 | 511 | 23 | 1 | 0 |
| 2 | 381 | 37 | 3 | 2 |
| 3 | 253 | 51 | 3 | 2 |
| 4 | 509 | 71 | 3 | 2 |
| 5 | 381 | 85 | 3 | 2 |
| 6 | 639 | 105 | 1 | 0 |
| 7 | 383 | 117 | 1 | 0 |
| 8 | 511 | 135 | 1 | 0 |
| 9 | 255 | 147 | 1 | 0 |
| 10 | 63 | 160 | 1 | 0 |

FIG. 17

1K:1 MUX SETTINGS FOR TIME 2 LOGIC UNIT 0.

| INPUT INDEX | SELECT VALUE | SHIFT REGISTER INDEX | SHIFT REGISTER DELAY | TIME GENERATED |
|---|---|---|---|---|
| 0 | 447 | 6 | 1 | 1 |
| 1 | 191 | 18 | 1 | 1 |
| 2 | 380 | 37 | 4 | 2 |
| 3 | 252 | 51 | 4 | 2 |
| 4 | 508 | 71 | 4 | 2 |
| 5 | 380 | 85 | 4 | 2 |

FIG. 18

48:1 MUX SETTINGS FOR TIME 0

| MUX INDEX | SELECT VALUE | LOGIC BUS WIRE | LOGIC UNIT | LOGIC OUTPUT | INPUT VALUE |
|---|---|---|---|---|---|
| 23 | 44 | 357 | 1 | 1 | CLOCK |
| 105 | 44 | 356 | 1 | 0 | RESET |
| 117 | 44 | 355 | 0 | 3 | C3 |
| 135 | 44 | 354 | 0 | 2 | C2 |
| 147 | 44 | 353 | 0 | 1 | C1 |
| 160 | 44 | 352 | 0 | 0 | C0 |

FIG. 19

48:1 MUX SETTINGS FOR TIME 1

| MUX INDEX | SELECT VALUE | LOGIC BUS WIRE | LOGIC UNIT | LOGIC OUTPUT | INPUT VALUE |
|---|---|---|---|---|---|
| 6 | 44 | 353 | 0 | 1 | CLOCK_POSEDGE |
| 7 | 44 | 354 | 0 | 2 | CLOCK_DELAYED |
| 18 | 44 | 352 | 0 | 0 | CLEAR |

FIG. 20

48:1 MUX SETTINGS FOR TIME 2

| MUX INDEX | SELECT VALUE | LOGIC BUS WIRE | LOGIC UNIT | LOGIC OUTPUT | INPUT VALUE |
|---|---|---|---|---|---|
| 37 | 44 | 352 | 0 | 0 | Q3 |
| 51 | 44 | 353 | 0 | 1 | Q2 |
| 71 | 44 | 354 | 0 | 2 | Q1 |
| 85 | 44 | 355 | 0 | 3 | Q0 |

FIG. 21

502 — $ADDRESSFMT [H|O|B]
$DATAFMT [H|O|B]
*start_addr* [ : *end_addr* ] / *value* [ ; *value*]*
*start_addr* [ : *end_addr* ] / *value* [ ; *value*]*
. . .

FIG. 52

$ADDRESSFMT H
$DATAFMT H
4 : 7/0
0 : 3/a
8/4
9 : f/8; 7; 6; 5; 0; a; 7

FIG. 53

CHECKPOINTING IN AN EMULATION SYSTEM

RELATED APPLICATION INFORMATION

This application relies on the filing date of U.S. Provisional application Ser. No. 60/019,078 of Chilton et al., entitled "Checkpointing in an Emulation system," filed Jun. 3, 1996, which is herein incorporated by reference. This application relates to prior filed U.S. patent application Ser. No. 08/496,239, of Chilton et al., filed Jun. 28, 1995, entitled "Emulation System Having Multiple Emulated Clock Cycles and Improved Signal Routing," which is herein incorporated by reference.

FIELD OF THE INVENTION

This application relates to a method and apparatus for emulating a circuit and, in particular, to a method and apparatus for saving a state of such an emulation for later use.

BACKGROUND OF THE INVENTION

As electronic circuit designs continue to increase in speed and complexity, it becomes ever more critical to test the developing circuit designs at various stages of development. Hardware emulators provide a means to test complex circuit designs as the designs are being developed. Such emulators typically provide configurable hardware that is controlled by software to perform the functions of a circuit being designed. The circuit design is specified by a set of data which defines the circuit structure and behavior.

Emulators operate under software control. The circuit design is "compiled" to produce the program that controls the emulator. The process of compiling the design to produce the program for the emulator is a critical and lengthy process. A lengthy compile time is due, in part, to the goal of producing a program that emulates the circuit design as fast as possible. Speed is of the essence in emulators because inevitably the emulator cannot perform the functions of the circuit being emulated as quickly as the actual circuit, itself. It is desirable to operate the emulator at speeds as close as possible to the target operating speed of the emulated circuit for purposes of accurately interfacing the design to external circuits or other devices and to test the circuit for timing problems.

Another reason why the compilation step is complex and time consuming is that constraints in the hardware of the emulator make it difficult to optimize the program for speed without making many computations during compilation. Since an emulator must perform the functionality of a wide range of circuit designs, it should be as flexible as possible. This means the emulation system must contain logic processing hardware that is reusable for different designs. Such an emulation system would contain a large number of general purpose processing elements that are used to indirectly perform the function of the circuit being emulated. For example, a general purpose emulator would process multiple boolean logic equations to emulate a multiplier circuit rather than use a dedicated hardware multiplier for the same purpose which would then become unusable in the emulation of circuit designs which do not contain any multiplier functions. In order to solve these equations, many gates, or other devices, in the emulator must be provided with signals. Further, the outputs of the gates or other components must be routed efficiently among the various components of the emulator.

Emulators generally are capable of executing at close to real-time speeds. Thus, for example, an emulation of a circuit that attaches to a target system (a bus, for example) can be hooked to the physical bus during testing. Sometimes, emulation reveals errors in the emulated circuit that are intermittent. For example, a failure may occur randomly on the order of every twelve hours. Such an intermittent problem is very difficult to fix because each attempt at repair (i.e., a new version of the circuit to emulate) requires that the emulator execute for an average of twelve hours before the situation causing the failure reoccurs.

During the design process, emulators and simulators are used for different purposes. For example, an emulator runs in real-time and allows the hardware designer to test his circuit in a real-time environment. In contrast, a simulator, which does not usually run in real time, allows the user to perform more detailed debugging processes on the circuit. Suppose, for example, that the designer has designed a circuit with a long boot sequence that requires millions of clock cycles to run before the design being verified is ready for detailed debugging. The designer desires to perform the detailed debugging with a software simulator, but getting past the boot sequence using the simulator could take years for conventional simulators. What is needed is a way to mix the functions of the simulator and emulator, drawing on the real-time performance of the emulator when that capability is useful and drawing on the extensive debugging capabilities of the simulator when that capability is useful.

SUMMARY OF THE INVENTION

The present invention overcomes the problems and disadvantages of the prior art by allowing the user to save state information about a current state of a currently executing emulator and outputting the state information in a predetermined format. The output of the present invention can be used both by the emulator (to restart the emulator in the output state) or by a simulator, to perform detailed debugging starting with the output state of the emulator. In addition, the simulator can provide output using the same format as the emulator, so that information can be passed between the simulator and emulator and vice versa.

In accordance with the purpose of the invention, as embodied and broadly described herein, the invention is [FIRST BROAD CLAIM HERE (IN PARAGRAPH FORM)]

In further accordance with the purpose of this invention, as embodied and broadly described herein, the invention is [SECOND BROAD CLAIM HERE (IN PARAGRAPH FORM)]

Objects and advantages of the invention will be set forth in part in the description which follows and in part will be obvious from the description or may be learned by practice of the invention. The objects and advantages of the invention will be realized and attained by means of the elements and combinations particularly pointed out in the appended claims and equivalents.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 12 shows assignments of logic functions to logic processors;

FIG. 13 shows assignments of logic processors to timeslices and bus wires;

FIG. 14 shows the assignment of inputs to bus wires;

FIG. 17 shows the MUX settings for the 1K:1 selectors in timeslice 1;

FIG. 18 shows the MUX settings for the 1K:1 selectors in timeslice 2;

FIG. 19 shows the settings for the 48:1 multiplexers in timeslice 0;

FIG. 20 shows the settings for the 48:1 multiplexers in timeslice 1;

FIG. 21 shows the settings for the 48:1 multiplexers in timeslice 2;

FIG. 52 is an example of a format expected by a simulator interfacing with an emulator according to the present invention;

FIG. 53 shows an example of data using the format of FIG. 33(a);

DETAILED DESCRIPTION OF THE PREFERRED EMBODIMENTS

Reference will now be made in detail to the preferred embodiments of the invention, examples of which are illustrated in the accompanying drawings. Wherever possible, the same reference numbers will be used throughout the drawings to refer to the same or like parts.

Figure 1:
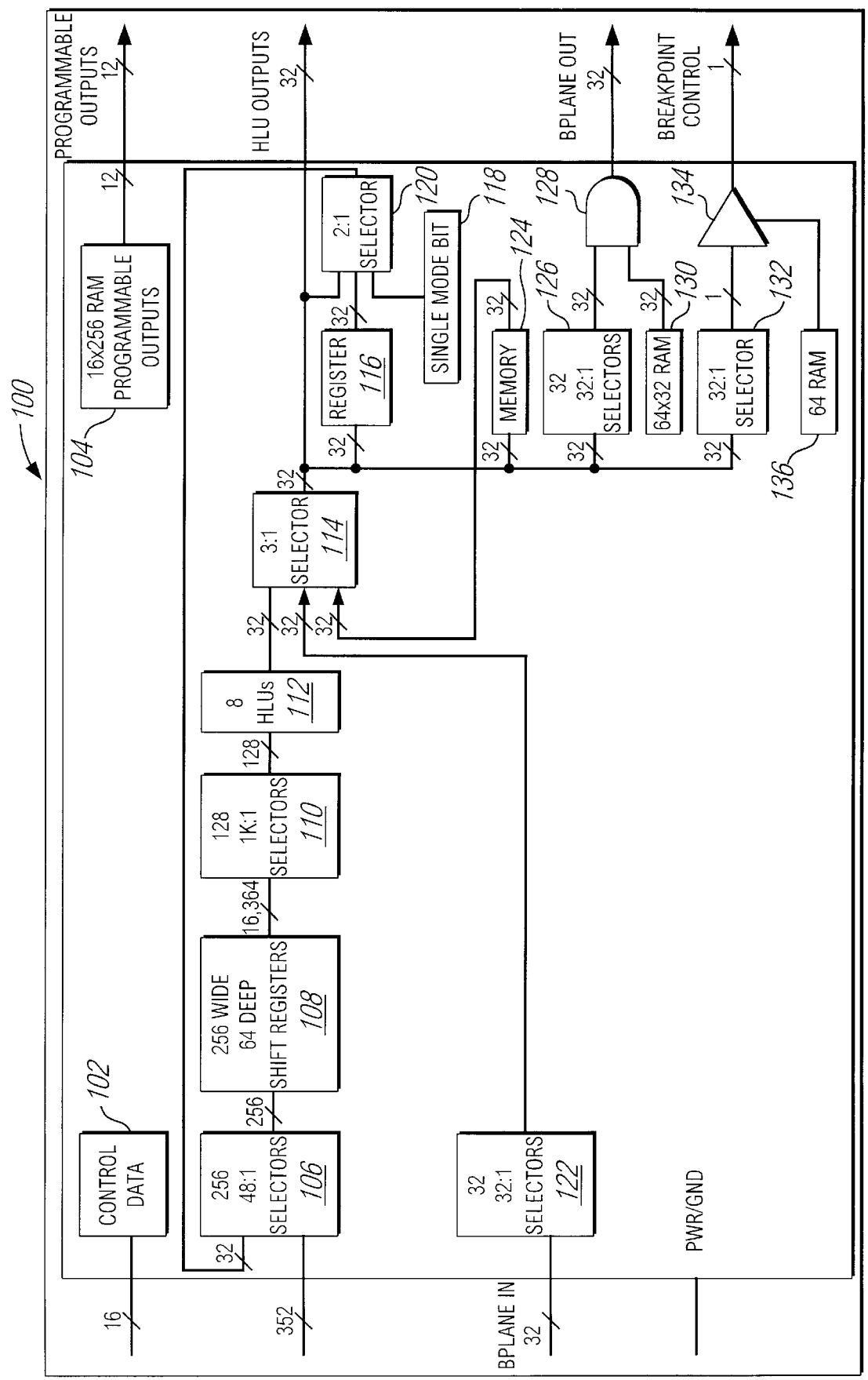
FIG. 1 is a system level block diagram of a single integrated circuit in the emulator of the present invention.

FIG. 1 is a system level block diagram of a single "chip" in a preferred embodiment of the emulator of the present invention. The preferred embodiment discussed herein is intended to be produced as a commercial product known during development as the Hydra Logic Emulation System and referred to here as the "logic emulation system," developed by Arkos Design, Inc. The design shown at the system level as chip 100 in FIG. 1 is fabricated on a single integrated circuit (IC) package referred to as the Hydra Chip. Additional FIGS. 2–7 show board-level and block-level details of the logic emulator system. Although a specific embodiment of an emulator is discussed for illustrative purposes, the scope of the invention is not limited to this specific embodiment.

In FIG. 1, chip 100 includes various subcircuits for performing specific functions. The subcircuits are shown as blocks in FIG. 1, such as control data 102. In discussing the emulation system the architecture of the logic emulation system is presented in the section immediately below. Next, a detailed discussion of selected subcircuits in the logic emulation system is presented with a focus on subcircuits 106–112 which concern the selector and shift register routing of data to the Hydra logic units ("HLUs") that give the logic emulation system a special advantage in its ability to universally and uniformly route variable data among the HLUs. ID a subsequent text section an example of compiling a circuit for execution in the emulation system is provided.

I. Logic Emulation system Architecture

In FIG. 1, control data 102 is used to store the microcode control words that direct the operation of the Hydra Chip ("chip") . Id the preferred embodiment, control data 102 provides for 64 control wards, each of approximately 10,000 bits in width. Various numbers of bits in each control word are routed, by means of control lines, to other functional blocks on the chip to control, e.g., n:1 selectors, shift registers, pass gates, signal inversion, as discussed below. For ease of illustration the control lines are omitted from FIG. 1. However, it will be apparent that the control words may be used in manners well-known in the art to control the various devices and functional blocks.

Control data 102 is loaded with up to 64 control words of the control program generated by a compiler. The compiler is software that receives, as input, a specification of a circuit to be emulated and outputs a control program in the form of equations and control logic to cause the chip to emulate the desired circuit. The words of the control program are executed each emulation cycle, where an emulation cycle is one cycle of the emulated circuit. That is, if a circuit being emulated runs at 1 MHz the emulation cycle is 1.0 uS. This means that all of the steps in the program must complete within 1.0 uS. Since there are a maximum of 64 program steps allowed, the emulator clock would rum at 64 MHz magnum. If there are less than 64 program steps, the emulator clock speed can be slowed down accordingly. A detailed description of the approach of using multiple emulator clock cycles per emulated clock cycle, and the advantages of doing so, may be found in related copending patent application Ser. No. 08/242,164, now abandoned.

The emulator includes the ability to lengthen any of the program steps by up to three additional emulator clock cycles. This is useful for interfacing the emulator to target hardware requiring longer access times. When program steps are lengthened this naturally extends the overall program cycle accordingly.

Programmable outputs RAM 104 is a 16×256 bit random access memory (RAM) to provide the chip with a way to send predefined output values to external circuitry. As shown in FIG. 1, 12 bits exit from the chip to the outside world for use in interfacing to external circuits. The other four bits of each word are "internal use" bits used to control chip functions. Programmable outputs RAM 104 allows the compiler to define "canned" output values for output at specified times within an emulated clock cycle. There are 256 addresses that are sequenced in order according to the emulator clock. There are four times as many word locations in RAM 104 as there are control data word locations in control data 102 because the chip allows for control data cycles to be extended by up to three additional cycles. Thus, each of the 64 control words can be maintained on the output lines of control data 102 for up to four cycles. Meanwhile, the address locations of RAM 104 are still incremented. This allows values from RAM 104 to be output within a control word cycle when the control word is being extended. The rate at which RAM 104 is sequenced, using the present example, is 64 MHz.

Functional blocks 106–112 form the heart of the routing and processing ability of the chip. These blocks are discussed in detail, below. Essentially, blocks 106–110 provide multiplexing and shift register/storing ability for variable values that are fed to HLUs 112 for processing.

Functional block 112 includes 8 logic units, each consisting of four Hydra Logic Processors ("processor") with four outputs, for a total of 32 outputs. These outputs from the 8 internal logic units are included as inputs to 3:1 Selector 114. 3:1 Selector 114's other inputs include signals from the backplane (designated as BPlane in) via 32:1 Selectors 112. This allows any of the 32 backplane signals to be routed to any of the inputs of 3:1 selector 114. The backplane signals are inter-board signals. The board-level design of the logic emulation system is discussed below in connection with FIG. 7. The third set of inputs to 3:1 Selector 114 is from Memory 124. Memory 124 is connected to the output of 3:1 selector 114 to allow the emulation system to emulate a RAM, or multiple RAMs, in the user's circuit design. The outputs of 3:1 Selector 114 are provided to 2:1 Selector 120 and to pin pads in the chip. 2:1 Selector 120 acts to return the signals back to the inputs of the HLUs via the routing arrangement of blocks 106–110. Thus, 3:1 Selector 114 allows the system to select from among three separate signal sources to output to processors both within, and external to, the chip on which the processor function of the emulation system of the present invention is fabricated.

In the preferred embodiment, Memory 124 is a 4K×32 bit RAM. The RAM is addressed from signals generated by the HLUs local to the chip, and external to the chip, via the backplane. One or more bits of the address may be obtained, and stored for use each emulator cycle. The address is built and latched piecemeal over one or more cycles so that the system has wide flexibility in emulating the address logic in the circuit design being emulated. The structures for latching and applying the address are not shown in FIG. 1. Data values for the RAM are obtained from the outputs of the HLUs, from the backplane, or from the RAM, itself.

Register 116 provides for storing the output values from the HLUs so that they may be delayed by one emulator cycle or more. Whether the current variable values, or the stored variable values from register 116, are output is determined by single mode bit 118 attached to the control line of 2:1 selector 120. Single mode bit 118 is obtained from one of the four "internal use" bits of RAM 104 discussed above, thus it is changeable each emulator clock cycle.

32:1 selectors 126, AND gates 128 and RAM 130 allow signals from the HLUs to be selectively output onto the backplane for use by processors on other boards. The signals are placed onto the backplane bus by using open-collector drivers so that the signals from each chip are effectively "wire ORed" onto the backplane. RAM 130 is loaded by the compiler and is used to enable specific signals onto the backplane each emulated clock cycle since one of each of the used control words in RAM 130 is addressed consecutively once each emulated clock cycle.

32:1 selectors 132 are used along with drivers 134 and RAM 136 to output breakpoint control signals. RAM 136 functions similarly to RAM 130 in that it is loaded by the compiler as part of the emulator program and its address is incremented once each emulator clock cycle. Breakpoints are implemented by having the HLUs evaluate equations to check for signal (i.e., variable) states and, upon detecting the desired combination, outputting a high signal that is selected by 32:1 selector 132. 32:1 selector 132 is controlled, as are the other selectors of FIG. 1 except for selector 120, by control signals from control data 102.

The routing and processing of blocks 106–112 will next be discussed in detail.

A Routing

Functional blocks 106–112 are the core of Hydra Chip 100's routing and processing. Since the chip relies on multiple emulator cycles per emulated cycle it is crucial that data can be quickly and easily routed between the various local and remote (i.e., on-chip and off-chip) processors so that several iterations of processing data with the same logic units (discussed below) can be efficiently achieved.

In FIG. 1, 256 48:1 selectors are used to choose from among 32 internal signal lines and 352 external signal lines.

The 32 internal signal lines are fed back from the outputs of the 8 HLUs 112 while the external signal lines are from 11 external processors, each identical to the diagram of FIG. 1, to provide 11×32=352 signals. Thus, the total number of signals entering the 256 48:1 selectors 106 is 352+32=384. Each of the 384 signals is distributed to 32 inputs in the 256 48:1 selectors. Thus, the total number of inputs in the 48:1 selector group is 32×384=12,288.

The 48:1 selectors output 256 signals to 256 shift registers 108. The routing is one-to-one with each 48:1 selector output feeding a single 64 stage, or 64 bit, shift register input. The combination of 48:1 selector and shift register is referred to as a "pipe." Each stage of each shift register is output so that the number of outputs from the shift register group is 64×256=16,384 outputs. The 16,384 outputs are provided to the 128 1K:1 selectors.

The outputs of the 1K: I selectors are sent to 8 HLUs 112.

Each HLU receives the outputs from 16 1K:1 selectors.

Figure 2:
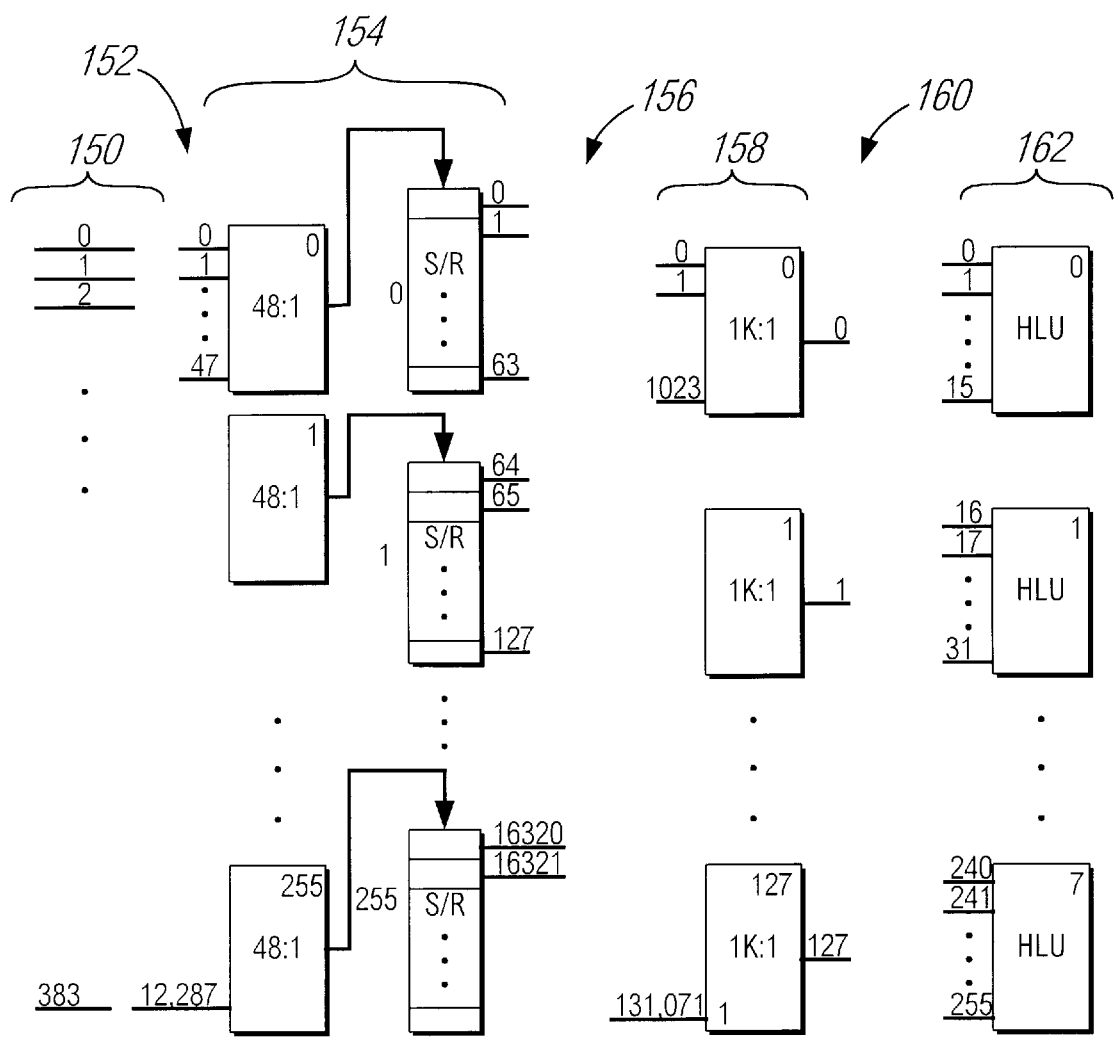
FIG. 2 shows an expanded diagram of the routing of some functional blocks in FIG. 1.

FIG. 2 shows an expanded diagram of the routing of blocks 106–112. In FIG. 2, 384 signals at 150 are provided to pipes at 154. The interconnections between the 384 signals and the pipes is at 152. A preferred interconnection scheme distributes each of the 384 signals to 32 different inputs of the 48:1 selectors. The preferred interconnection allows for routing each signal to 16 pairs of 64 bit shift registers. The pairs are separated so that the input signal fanouts have the smallest overlap possible. The exact connections are shown in U.S. application Ser. No. 08/496,239, of Chilton et al. entitled "Emulation System Having Multiple Emulated Clock Cycles Per Emulator Clock," filed Jun. 28,1995, which is herein incorporated by reference.

Connections between pipes at 154 and selectors at 158 are such that consecutive groups of 8 1K:1 selectors receive the same 1024 outputs from a group of 16 shift registers. For example, in the first group of 8 1K:1 selectors (selectors 0–7), each selector receives the same 1024 outputs from shift registers 0–15. In the next group of 8 1K:1 selectors (selectors 8–15), each selector receives the same 1024 outputs from the next 16 shift registers (shift register numbers 16–31) and so on.

Connections at 160 between 1K:1 selectors at 158 and HLUs at 162 are assigned by taking sixteen of the 1K:1 selectors modulo 16. For example, HLU 0 is connected to 1K:1 selectors 0, 16, 32, 48, . . . , 112. HLU 1 is connected to 1K:1 selectors 1, 17, 33, 49, . . . , 113.

Figure 3:
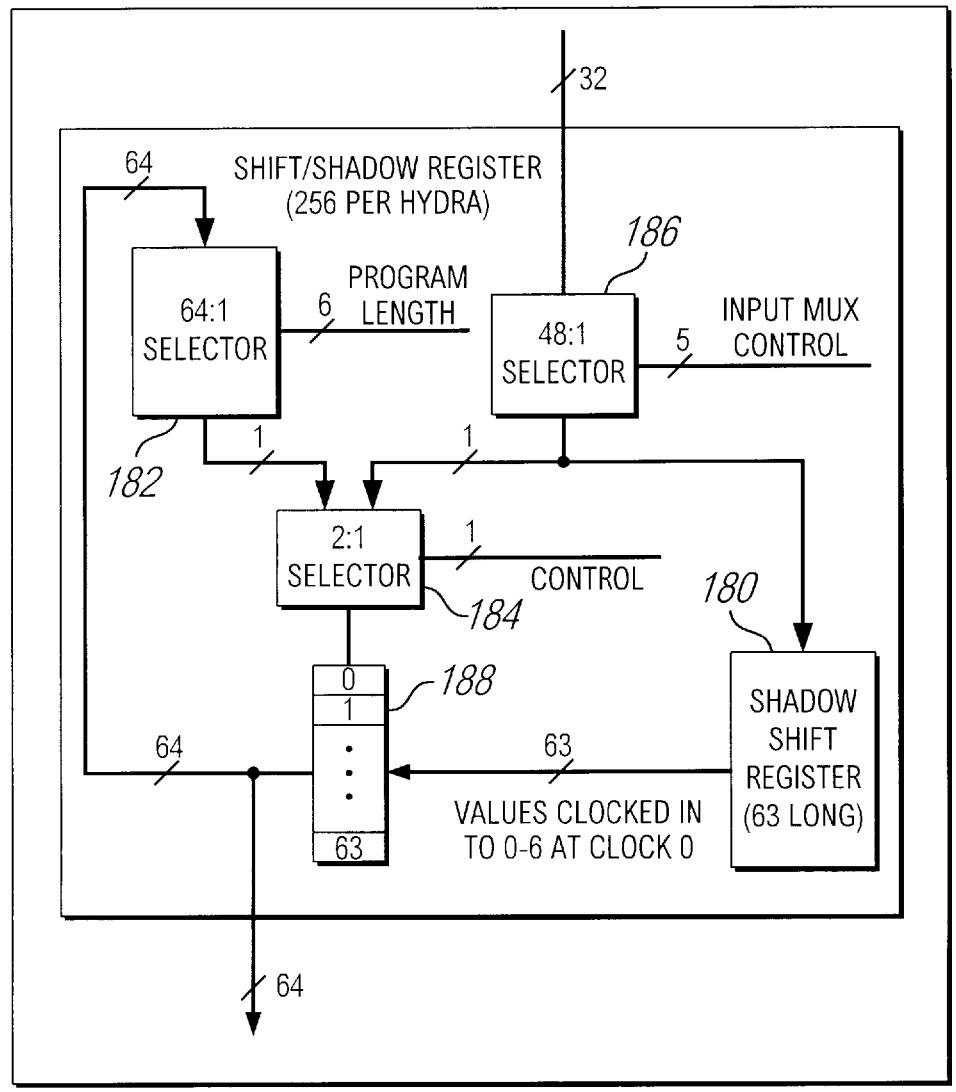
FIG. 3 shows more details of the circuitry of first functional blocks in FIG. 1.

FIG. 3 shows more details of the circuitry of functional blocks 106 and 108 of FIG. 1. Specifically, FIG. 3 shows the inclusion of a "shadow" shift register 180, 64:1 selector 182 and 2:1 selector 184. 48:1 selector 186 and shift register 188 are the same components discussed above and shown in FIG. 1 as 106 and 108, respectively.

The use of shadow shift register 180 provides distinct advantages in the ability of the emulation system of the present invention to handle logic elements such as flipflops where the state of the logic element which was computed during the current emulated clock cycle is not required as an input to other logic elements until the next emulated clock cycle. Shift register 188 is used to store results of computations in each of the 64 (maximum) steps in the emulation program. However, a special case occurs where, for example, a flip flop output, or any other "registered" signal, is not required until the next cycle. These registered signals must not be updated for use until the end of the current emulated clock cycle. Thus, the shadow register is used to store the values of these types of registered variables from the time they were generated until the time they are required as inputs to logic functions. At the end of the program cycle, i.e., after all program steps have been executed for the current cycle, the values from shadow shift register 180 are copied into shift register 188 so that the new values for these registered variables are available for use as inputs to the next program cycle. The copying is performed by loading shift register 188 with the parallel outputs of shadow shift register 180. This allows for time-independent routing of all "registered" signals through the emulator since the signals are not required until the following program cycle.

As can be seen from FIG. 3, values from 48:1 selector 186 are routed both to shadow shift register 180 and, selectively, to shift register 188 via 2:1 selector 184. Where the value from 48:1 selector 186 is a registered variable, the registered variable is copied to shadow shift register 180, only, and not to shift register 188. Instead, shift register 188 receives a value from 64:1 selector 182 which is generated during the previous program cycle so that any registered variables that change during the current program cycle are not updated until the next program cycle.

64:1 selector 182 allows values from anywhere within shift register 188 to be routed back to stage 0 of the shift register. This allows flexible access to variable values that are computed within a program cycle. The selection of variable through 64:1 selector 182 is by the six control lines shown connected to 64:1 selector 182 and which are controlled from the control data. Other control signals such as the five input multiplexer (MUX) lines to 48: 1 selector 186 and single control line to 2:1 selector 184 also issue from the control data.

B. Processing

Figure 4:
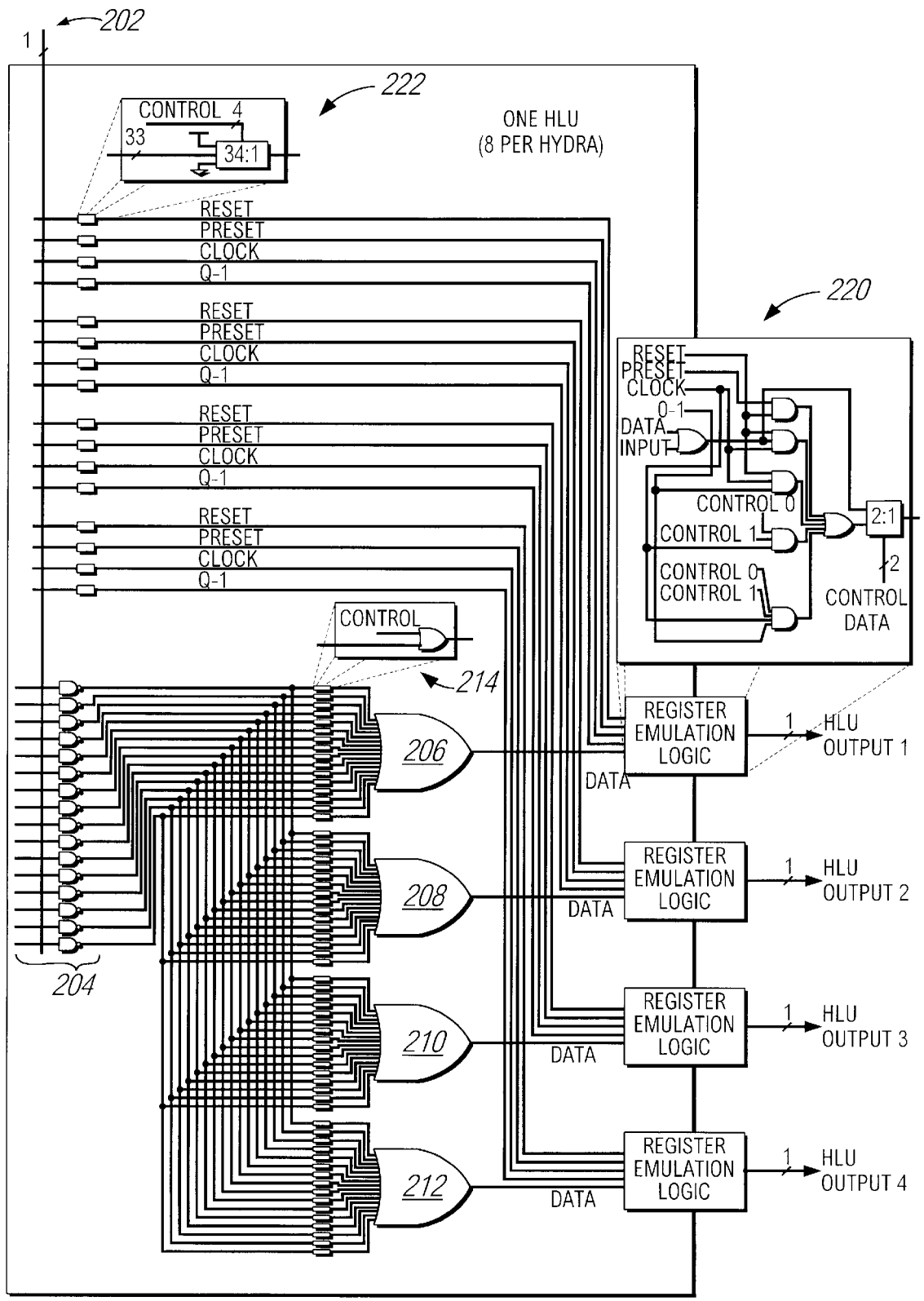
FIG. 4 shows an expanded diagram of the logic in the logic unit block of FIG. 1.
Figure 5:
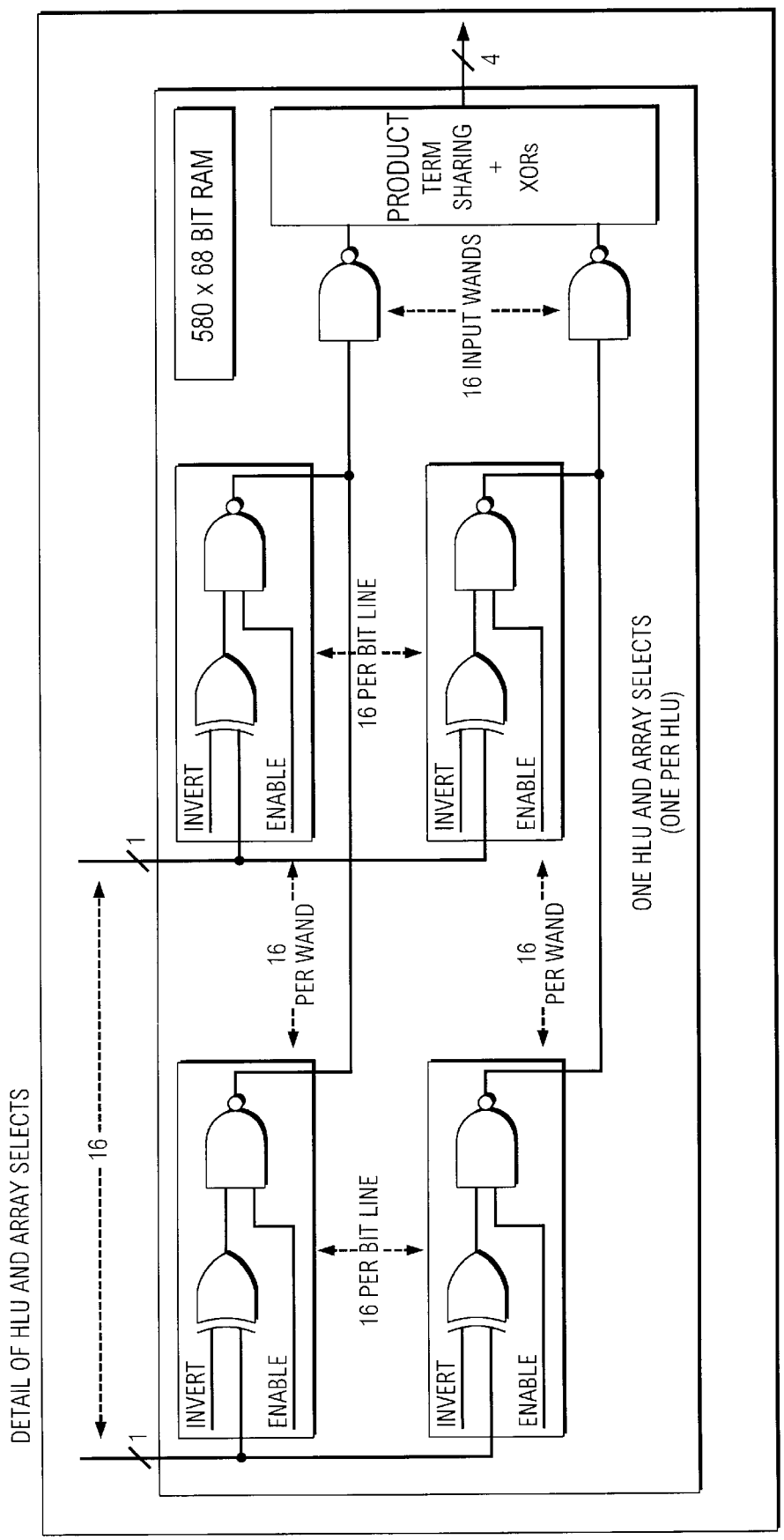
FIG. 5 shows more detail relating to the input wand circuitry of FIG. 4.

Next, FIGS. 4 and 5 are discussed to illustrate details of the Hydra logic units used for processing in the emulation system of the present invention.

FIG. 4 shows an expanded diagram of the logic in block 112 of FIG. 1. In FIG. 4 j one or 8 HLUs on the chip is shown. Sixteen inputs from 16 of the 1K:1 selectors enter the HLU at 202. The inverted signals are also provided so that a total of 32 signals is represented by the dark shaded line. The 16 signals are coupled through inverters and pass gates, also called input "wands,"11 shown in larger scale and more detail in FIG. 5, to the OR gates 206–212. Each of the 16 signals can be passed through each of the input wands so that any of the signals can be applied to any of the inputs of the OR gates 206–212. Note that each of the lines to the OR gates is provided with a NOR gate such as NOR gate 214 so that each input to the NOR gates can be selectively disabled with the application of a zero, or low, signal.

OR gates 206–212 are used to compute sum-of-products terms to solve boolean equations that emulate the functions of the user's circuit design. The compiler converts the user circuit design into boolean equations which are then converted into multiple program steps. The program steps are loaded into the emulation architecture in the form of microcode words in control data 102 of FIG. 1 and control signals in various select RAM throughout the system. In this respect, the system of the present application is similar to the system of copending patent application Ser. No. 08/242,164, now abandoned.

Returning to FIG. 4, register emulation logic 220 is provided at the output of each of the OR gates. Register emulation logic 220 provides specialized control signals to allow the emulator to handle sequential element emulation, such as registers and latches, in an efficient manner. Signals such as "Reset," "Preset, 11 "Clock" and 'IQ-111 represent signals of their well-known counterparts in standard sequential devices. These signals are obtained from the 16 input signals and their inverted signals by using 34:1 selectors as shown, for example, at 222. Note that the 34:1 selectors allow a high or low signal to be selected in addition to the 16 input signals and their inversions. Signal "Q-1" is normally the previous value of what was stored in a register being emulated.

The invert control bit of register emulation logic 220 allows inversion of the data signal according to control data. The P/R control signals determine whether a preset or reset will be controlling when both a preset and reset occur at the same time. The P/R control lines are coupled to control RAM, as are the two control bits to the 2:1 selector of register emulation logic 220. The 2:1 selector provides for a bypass of the register emulation logic when it is not needed.

Figure 6:
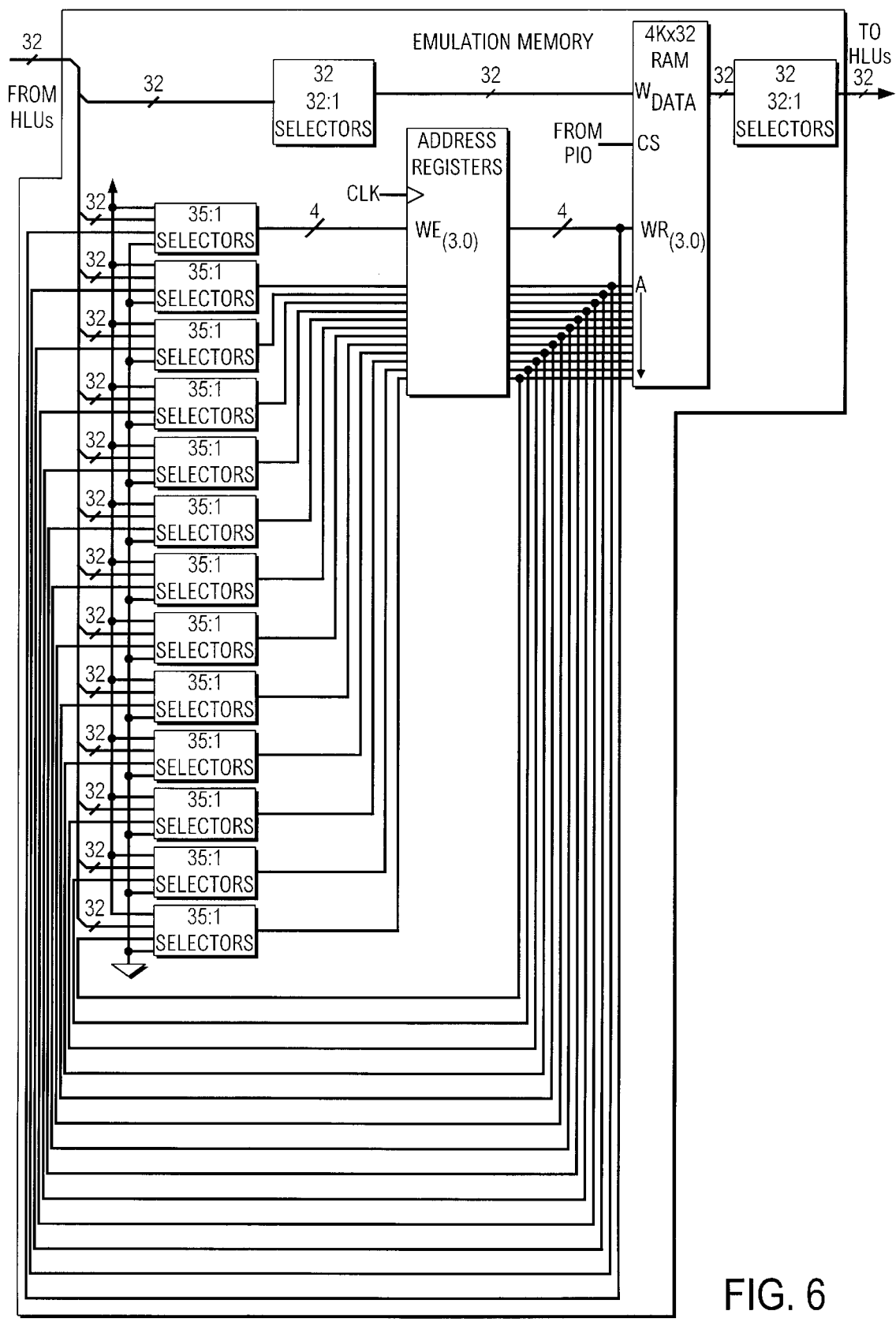
FIG. 6 shows more detail in the emulation memory block of FIG. 1.

FIG. 6 shows more detail in functional block 124, the emulation memory, of FIG. 1. The emulation memory circuitry provides an efficient way for the values generated from the HLUs to be stored and used in addressing the emulation memory.

Figure 7:
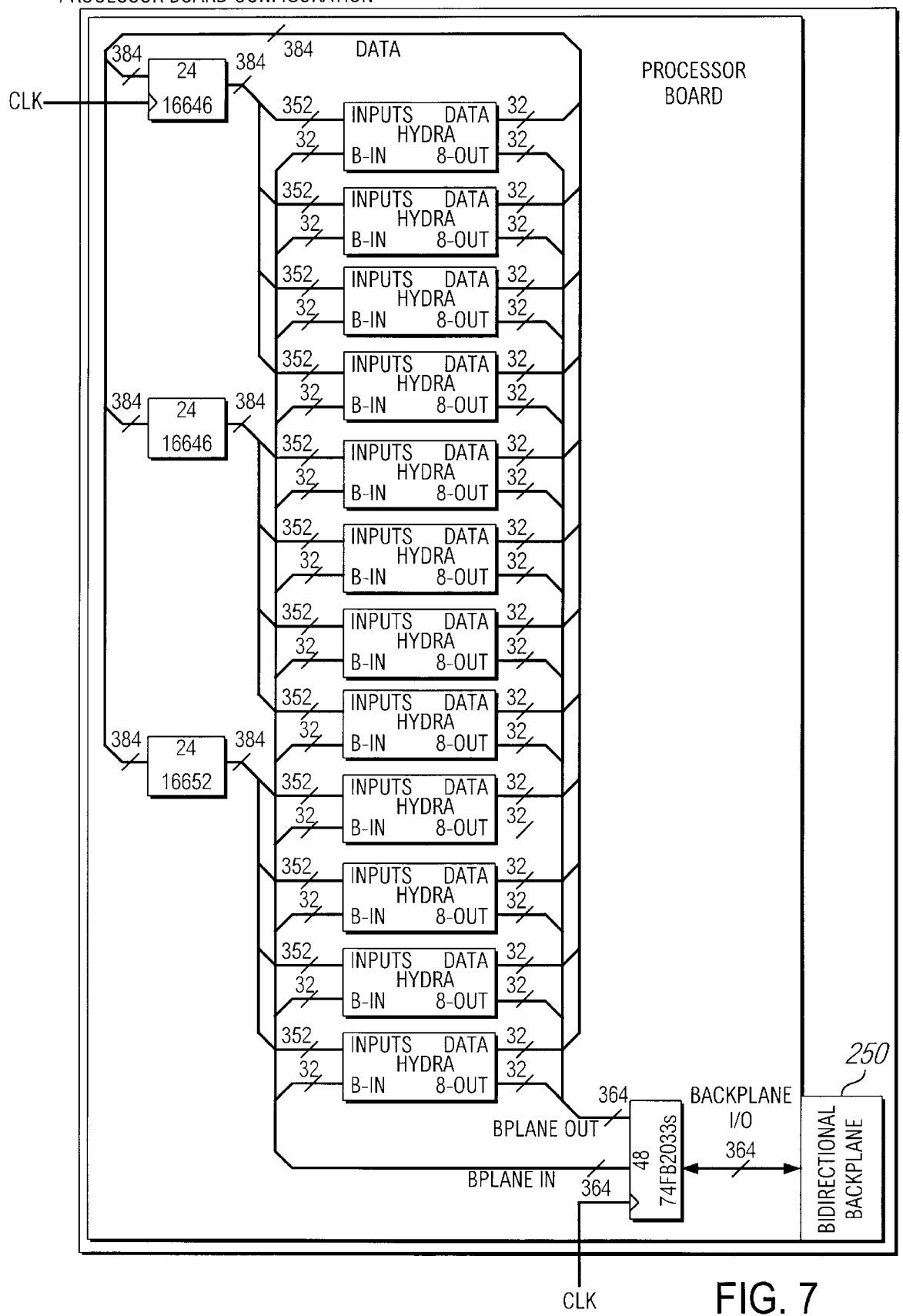
FIG. 7 shows a board level configuration of 12 logic unit chips of the present invention.

FIG. 7 shows a board level configuration of 12 Hydra chips. FIG. 7 includes backplane 250 that can accommodate additional similar boards. Devices (16646) are register transceivers while devices (74FB2033) are backplane interface transceivers.

II. Logic Emulation System Compiler Operation.

Figure 8A:
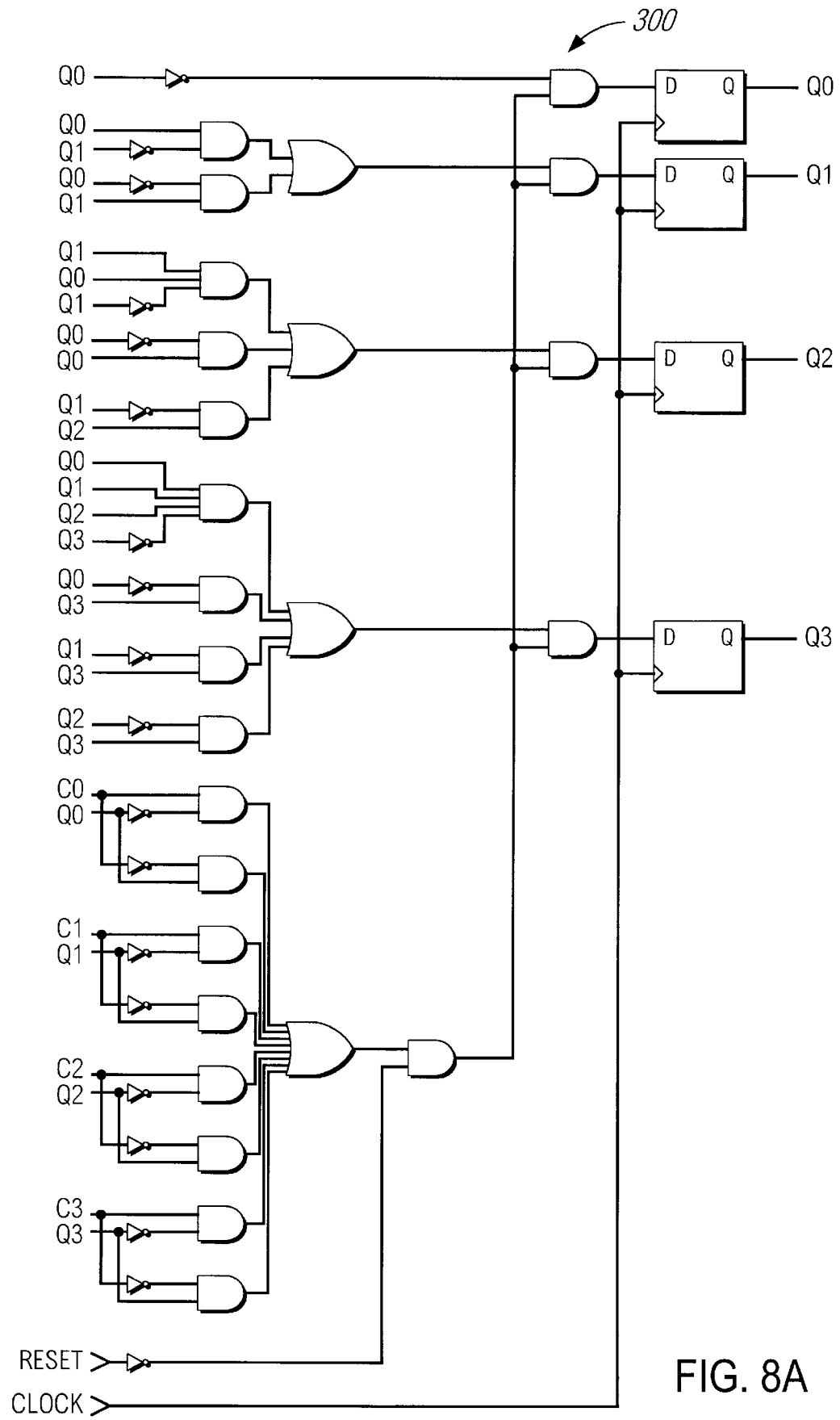
FIG. 8A shows an example of a circuit to be emulated.

FIG. 8A shows a circuit 300 as an example of a circuit that a user wishes to emulate. Circuit 300 is a 4-bit binary counter with outputs QO-3, termination count inputs CO-3, RESET and CLOCK signals. Termination count inputs CO-3 are used to specify when the counter resets. When the count on QO-3 matches the value specified on CO-3 the counter resets to 0 and resumes counting up.

Figure 8B:
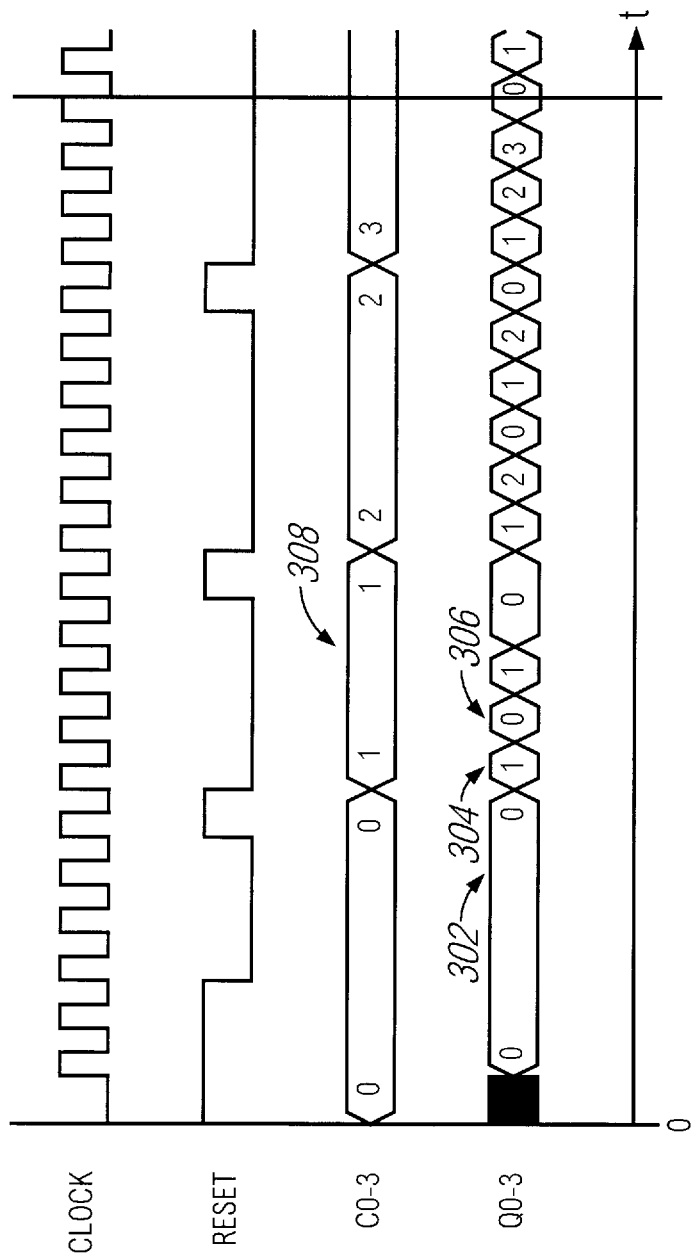
FIG. 8B shows the timing diagram for the circuit of FIG. 8A.

FIG. 8B shows the timing diagram for the circuit of FIG. 8A. In FIG. 8B, outputs QO-3 are shown to output different values (0, 1, 2 and 3) at different points in time according to the other signals CLOCK, RESET and terminal count bits CO-3. For example, at 302 outputs QO-3 output the value 0. At 304, outputs QO-3 output the value 1. At 306, outputs QO-3 are reset to the value 0 since terminal count bits CO-3 specify a terminal count of 1 at 308. Similarly, QO-3 are shown incrementing up to the terminal count currently specified for subsequent portions of the timing diagram. Note that the count changes on the leading edge of CLOCK and that whenever RESET is high the count becomes 0.

Figure 9:
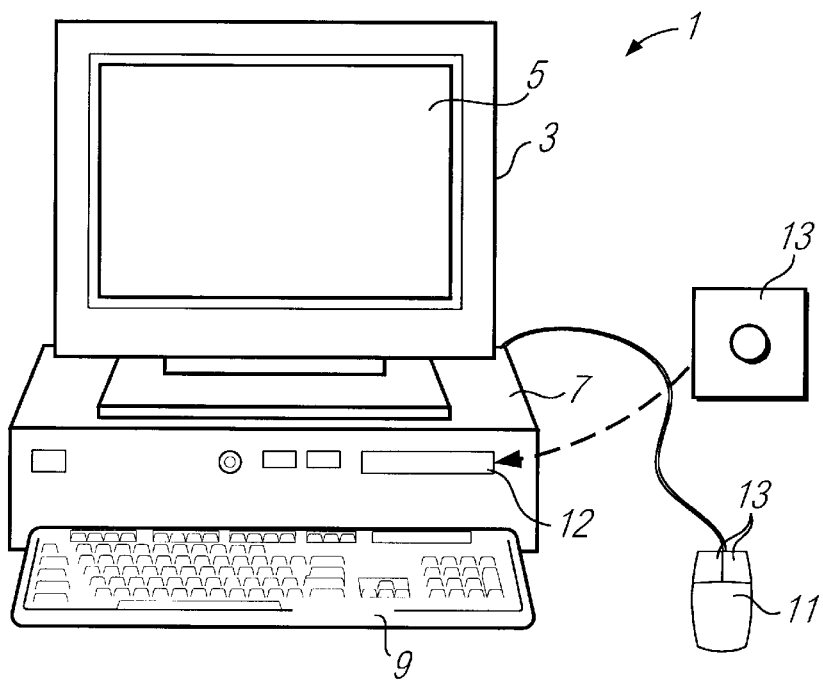
FIG. 9 is an illustration of a computer system suitable for use with the emulation system compiler of the present invention.

FIG. 9 is an illustration of a computer system suitable for use with the emulation system compiler of the present invention. FIG. 9 depicts but one example of many possible computer types or configurations capable of being used with the present invention. FIG. 9 shows computer system 1 including display device 3, display screen 5, cabinet 7, keyboard 9, mouse 11, and an input device 12 accepting a storage medium 13 storing computer code instructions. Mouse 11 and keyboard 9 are "user input devices." Other examples of user input devices are a touch screen, light pen, track ball, data glove, etc.

Figure 10:
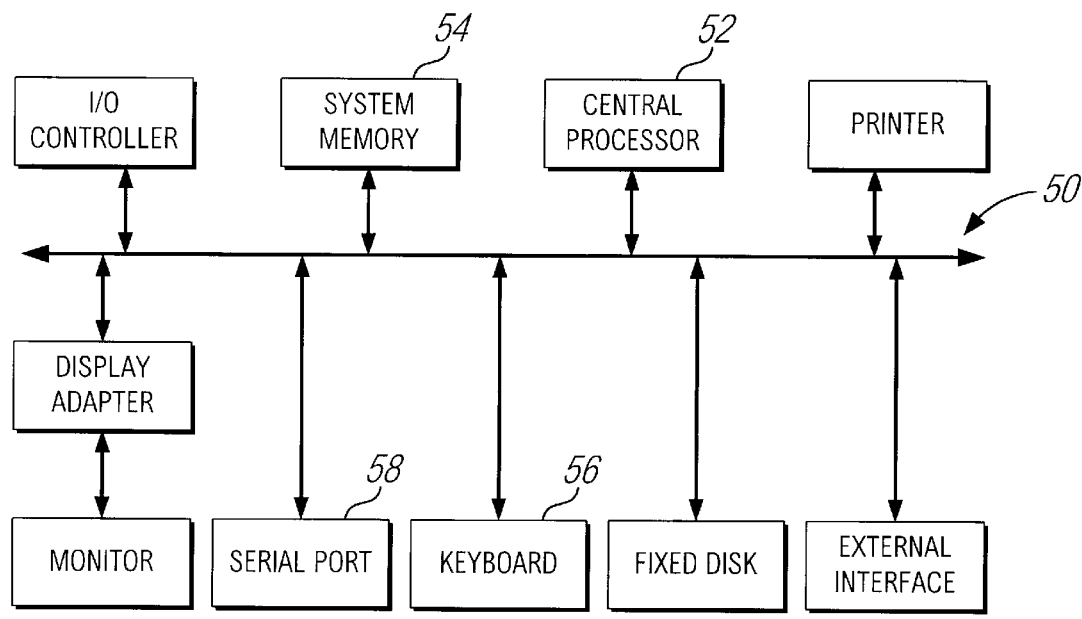
FIG. 10 is an illustration of basic subsystems in the computer system of FIG. 9.

FIG. 10 is an illustration of basic subsystems in computer system 1 of FIG. 9. In FIG. 10, subsystems are represented by blocks such as central processor 52, system memory 54, etc. The subsystems are interconnected via a system bus 50. Additional subsystems such as a printer, keyboard, fixed disk and others are shown. Other arrangements of subsystems and interconnections are possible.

The compiler accepts an electronic description of circuit 300 as input. In the preferred embodiment, many formats for the electronic description of a circuit are accepted such as the Verilog hardware description language. The compiler performs steps of "technology mapping" the circuit to map operations of the circuit to processors within the emulation system. The operations are converted to equations that one or more processors can solve within one cycle of the emulated circuit. The compiler also performs the step of "scheduling" the solution of the equations to insure that the results of equations that are needed as inputs to other equations are obtained before the other equations are executed. The steps of technology mapping and scheduling are performed advantageously in the present invention by making use of the uniform logic units and routing architecture described in section I, above.

Figure 57:
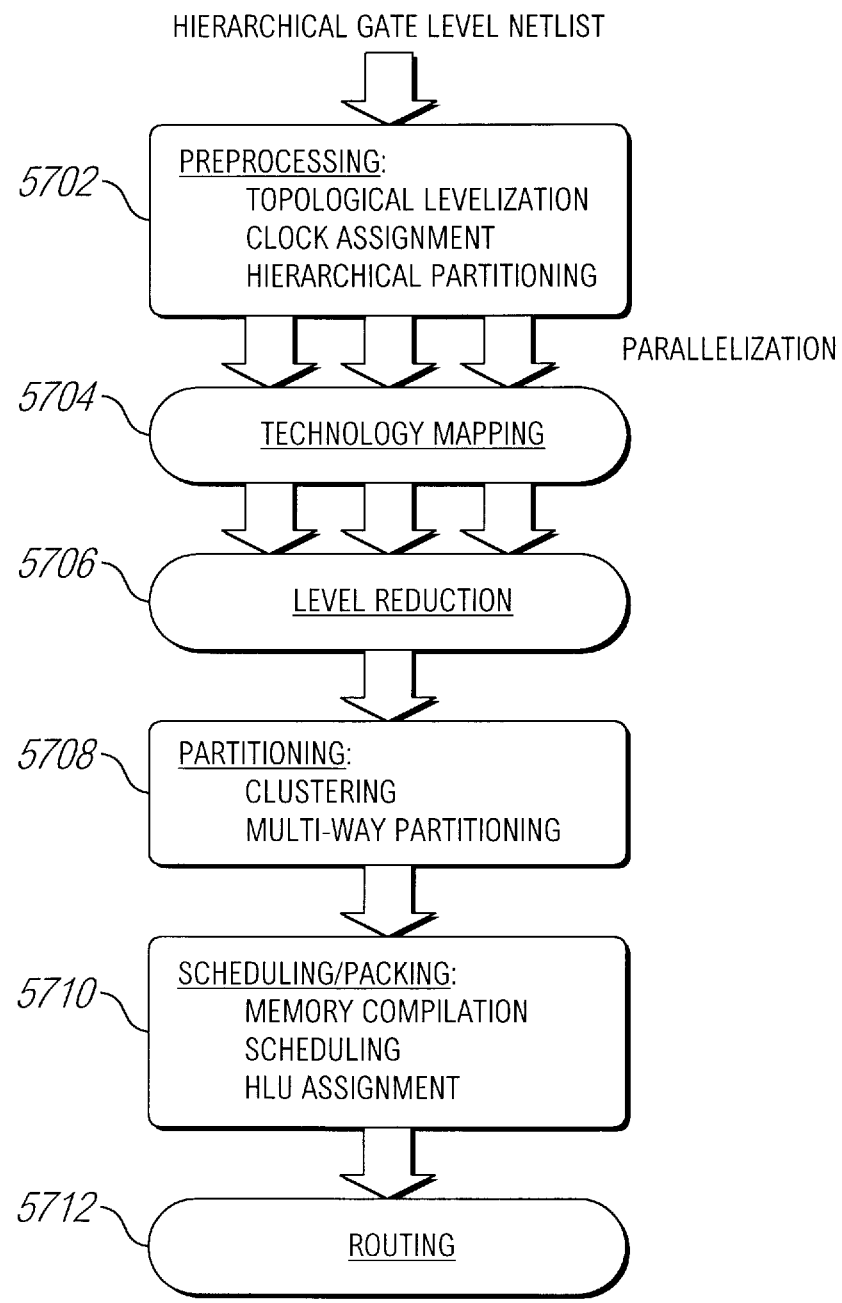
FIGS. 57 is a flow chart showing a method performed by a compiler used in a preferred embodiment of the invention.

The compiler uses the results of the technology mapping and scheduling steps to output an emulation program that is loaded into the control store, multiplexer select RAM and other portions of the emulation system to control the emulation system to solve the equations. Note that the solution of the equations is performed by executing up to 64 program steps within a single emulated clock period (i.e., the period of CLOCK in FIG. 8B). The source code defining the technology mapping and scheduling steps of the compiler is included in U.S. application Ser. No. 08/496,239, of Chilton et al. entitled "Emulation System Having Multiple Emulated Clock Cycles Per Emulator Clock," filed Jun. 28,1995, which is herein incorporated by reference. The compilation procedure is made more efficient due to the uniform connectivity of signals in the emulation system resulting in a "flat" programming model. This insures that, after technology mapping, subsequent scheduling steps will not affect the routability of the design being emulated. In other words, the technology mapping and scheduling steps are completely independent of the routing phase of the compilation and of each other. FIG. 57 is a flow chart showing a method performed by a compiler used in a preferred embodiment of the emulator.

Figure 11:
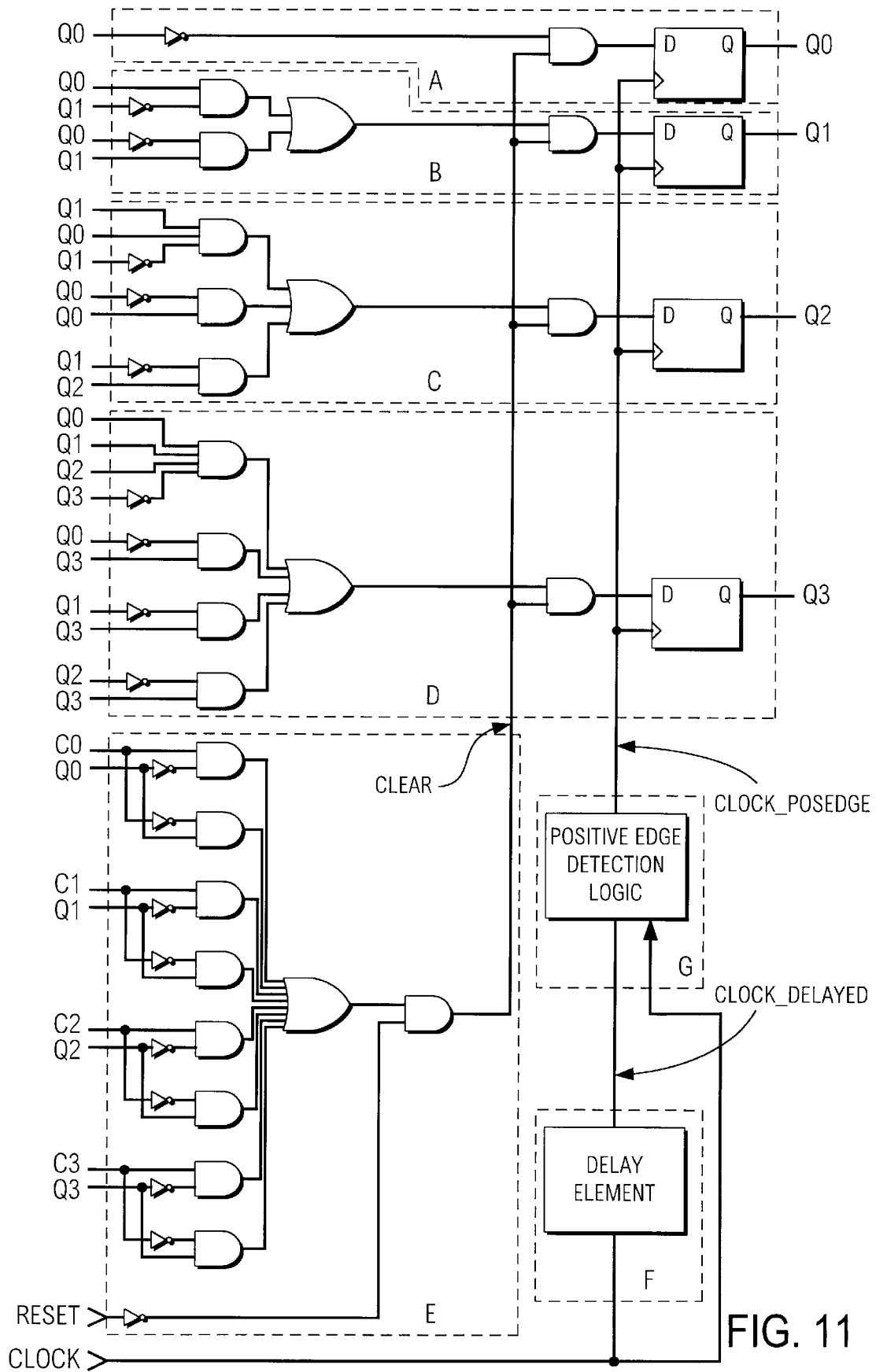
FIG. 11 shows a technology mapping of the circuit of FIG. 8A.

FIG. 11 shows a technology mapping of the circuit of FIG. 8A. In FIG. 11, the circuit has been divided into 7 logic functions labeled A–G. Note that each logic function is a sub-function in the operation of the circuit of FIG. 11, and each logic function can be realized by one logic processor. Each sub-function has clearly defined inputs and outputs and can be computed within each emulation clock cycle, or program step. At most, there are three logic "stages," or dependencies on signals that could arrive at different times in an emulation cycle.

The circuit of FIG. 8A is simple enough that the technology mapping and scheduling can be accomplished manually as in the diagram of FIG. 11. For purposes of illustration, seven logic functions are chosen in this example. Note that logic functions F and G include functionality that has been added to the circuit. This functionality accurately accounts for edge transitions in the clock signal, CLOCK. Since the registers which generate QO-3 are positive edge sensitive, logic functions F and G include an emulated delay element coupled to emulated positive edge detection logic to generate a signal indicating a positive CLOCK edge transition.

FIG. 12 shows assignments of the logic functions to logic processors (there are 32 logic processors, or 8 logic units, per chip, as discussed above in connection with the architecture of FIGS. 1–7), the inputs to each logic function, the earliest time that an input is needed (given in program steps), the output of the logic function and the latest time at which the logic function's output must be available. For the present example, each logic function in FIG. 11 is assigned to a separate processor. Each HLU has the ability to form four discrete sum-of-product terms and produce four outputs (i.e., four processors). So, for example, a single HLU can be used to handle logic functions A–D while a second HLU can handle logic functions E, F and G. However, as discussed below, the present example allows for a single HLU to handle all of the computations within three program steps. Because of the uniformity of routing in the emulator the assignments of HLUs, and processors within HLUs, are completely arbitrary with respect to routability.

Returning to FIG. 12, logic function A includes signals Q0, CLEAR and CLOCK_POSEDGE. Signals Q0 and CLEAR are inputs from the user's external circuitry that are interfaced to the emulation system as they would be with the actual circuit under emulation. Signal CLOCK_POSEDGE is generated as an output from logic function G to indicate the clock rising edge. Note that CLOCK_POSEDGE is generated from the signal CLOCK which is the user's clock from the circuit being emulated. In logic function A, signal Q0 is needed at program step 0, signal CLEAR is needed at program step 2 while signal CLOCK_POSEDGE is also needed at program step 2. Logic function A's output is Q0 which must be generated, at the latest, by the next program cycle.

In the present example there are only three program steps, occupying "timeslices" 0, 1 and 2. Each program step is performed during one clock period of the emulator clock. The emulator clock is generally operated as fast as possible since, inevitably, an emulated circuit is designed to be operated at a speed greater than the speed of the emulation program cycle. As mentioned, program steps can be extended to up to four emulator clock cycles where, for example, delays in the emulator require that the emulation system remain in a predetermined state, corresponding to a specific program step, for more than one cycle.

In FIG. 12, the remaining logic functions B–G are designated similarly to logic function A FIG. 13 shows assignments of logic processors to timeslices and bus wires. For example, output value Q0 is assigned to timeslice 2 and bus wire 355. As discussed above, there are 384 bus wires (O through 383) that are inputs to the 48:1 selectors. Bus wires 352 through 383 contain results which originate from logic units 0–7. The present example circuit design uses logic unit 0 exclusively and all of the signals are generated and used within a single chip containing the logic unit. In this case, no interchip data exchanges are necessary for the emulation. Note that signals CLEAR, CLOCK_DELAYED and CLOCK_POSEDGE are generated in timeslice while signals Q0-3 are generated in timeslice 2.

FIG. 14 shows the assignment of inputs to bus wires. The signals C0-3, RESET and CLOCK represent the six external inputs to the emulator. Each of the inputs are assumed available and valid at the beginning of the program cycle, i.e., at program step 0, when they are sampled.

FIGS. 13 and 14 represent the results of the scheduling step in the compilation process. The scheduling problem is to ensure that output values that are needed for a given calculation are available before the calculation requires the value. In other words, any calculation necessary to generate a value must be performed, or scheduled, ahead of the time that a subsequent calculations can use the value. This is a trivial problem in the present simple example, the solution of which is presented in FIGS. 13 and 14, but can be a very time consuming step in the compilation procedure where the circuit being emulated is large. An advantage of the present invention is that, contrary to prior emulation systems and compilers, the scheduling step does not influence the routability of the emulated design. This is due, in part, to the processors being fungible commodities in the emulation system of the present invention because there is no advantage to using a given processor over another in terms of input or output routing capability since all of the routing at the Hydra chip level is uniform among the processors.

Figure 15:
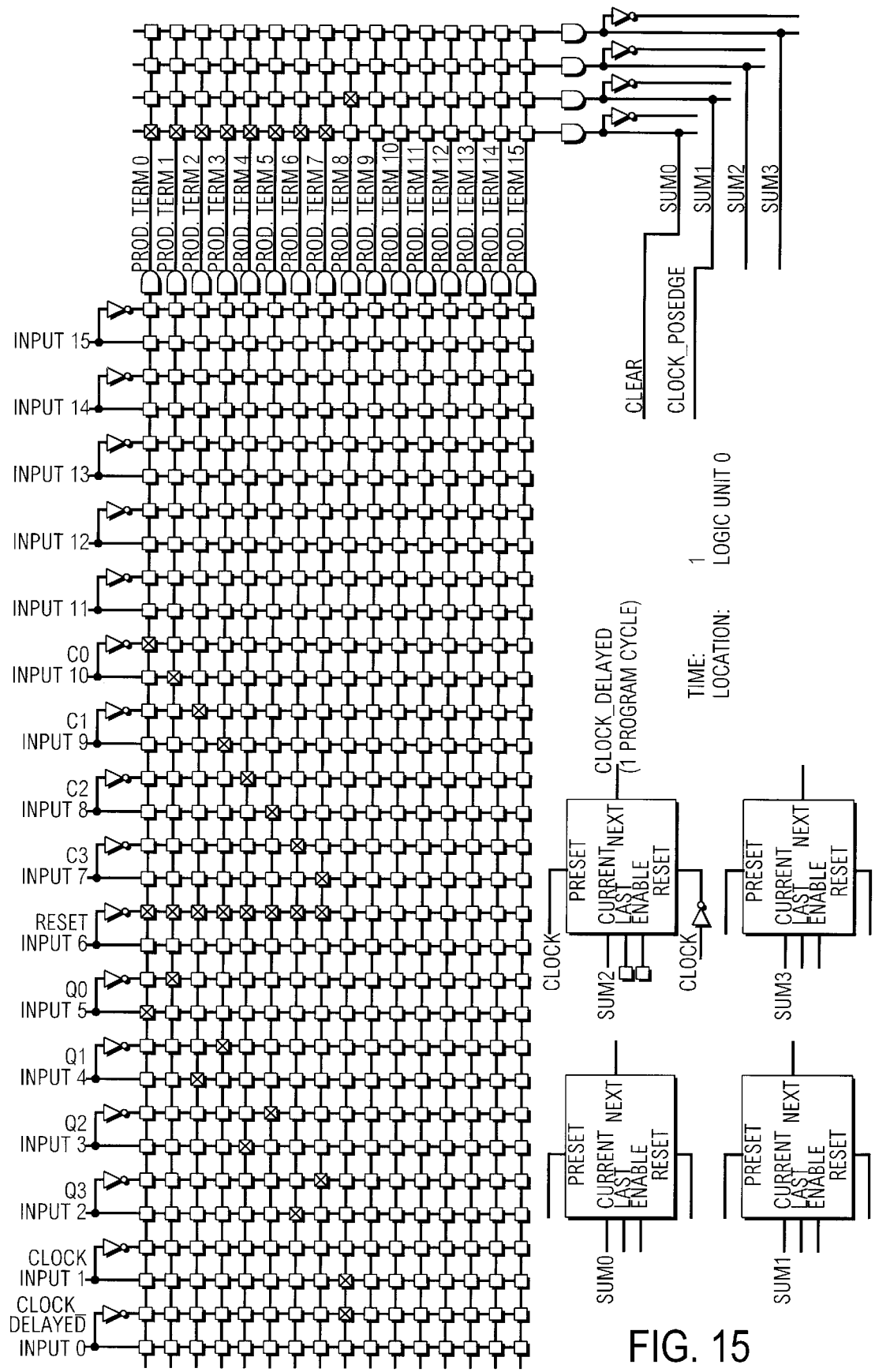
FIG. 15 is an input/output mapping for processors in timeslice 1.
Figure 16:
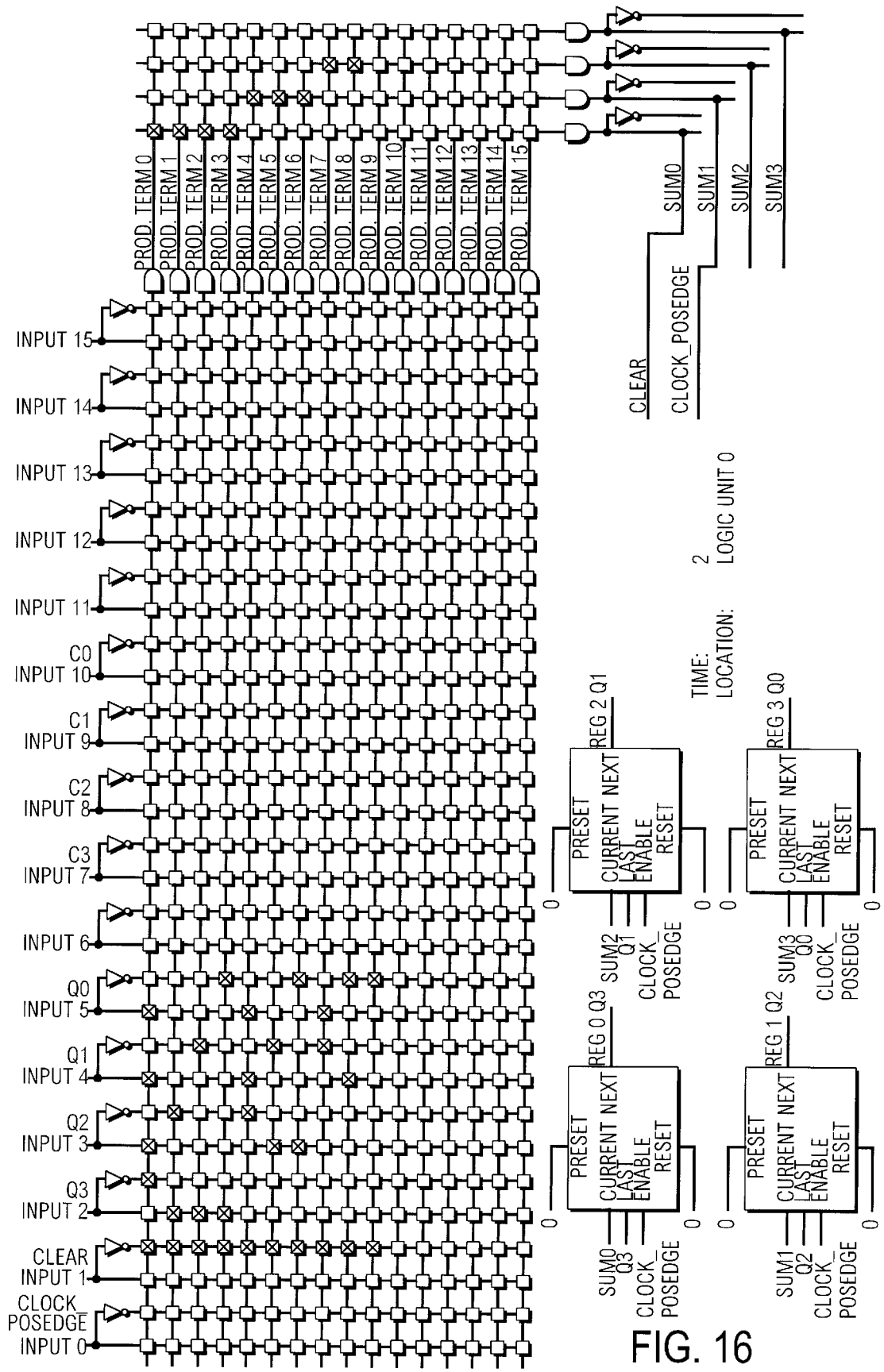
FIG. 16 is an input/output mapping for processors in timeslice 2.

FIGS. 15 and 16 show input and output mappings for the different processors in timeslices 1 and 2, respectively. Thus, it can be seen that, in FIG. 15, the signals CLEAR, CLOCK_DELAYED and CLOCK_POSEDGE are generated from the values C0-3, RESET, Q0-3 , CLOCK and CLOCK_DELAYED. The output CLOCK_DELAYED is generated by using register emulation logic such as that shown at 220 of FIG. 4. Similarly, FIG. 16 shows the mapping for signals computed in timeslice 2.

FIGS. 17 and 18 show the MUX settings for the 1K:1 selectors that are relevant for the processing of the present example. No settings are shown for timeslice 0 since the signals are not required for logic processing until timeslice 1.

FIGS. 19–21 show the MUX settings for the 48:1 MUXes in timeslices 0, 1 and 2.

III. Checkpointing the Emulation System

Figure 22:
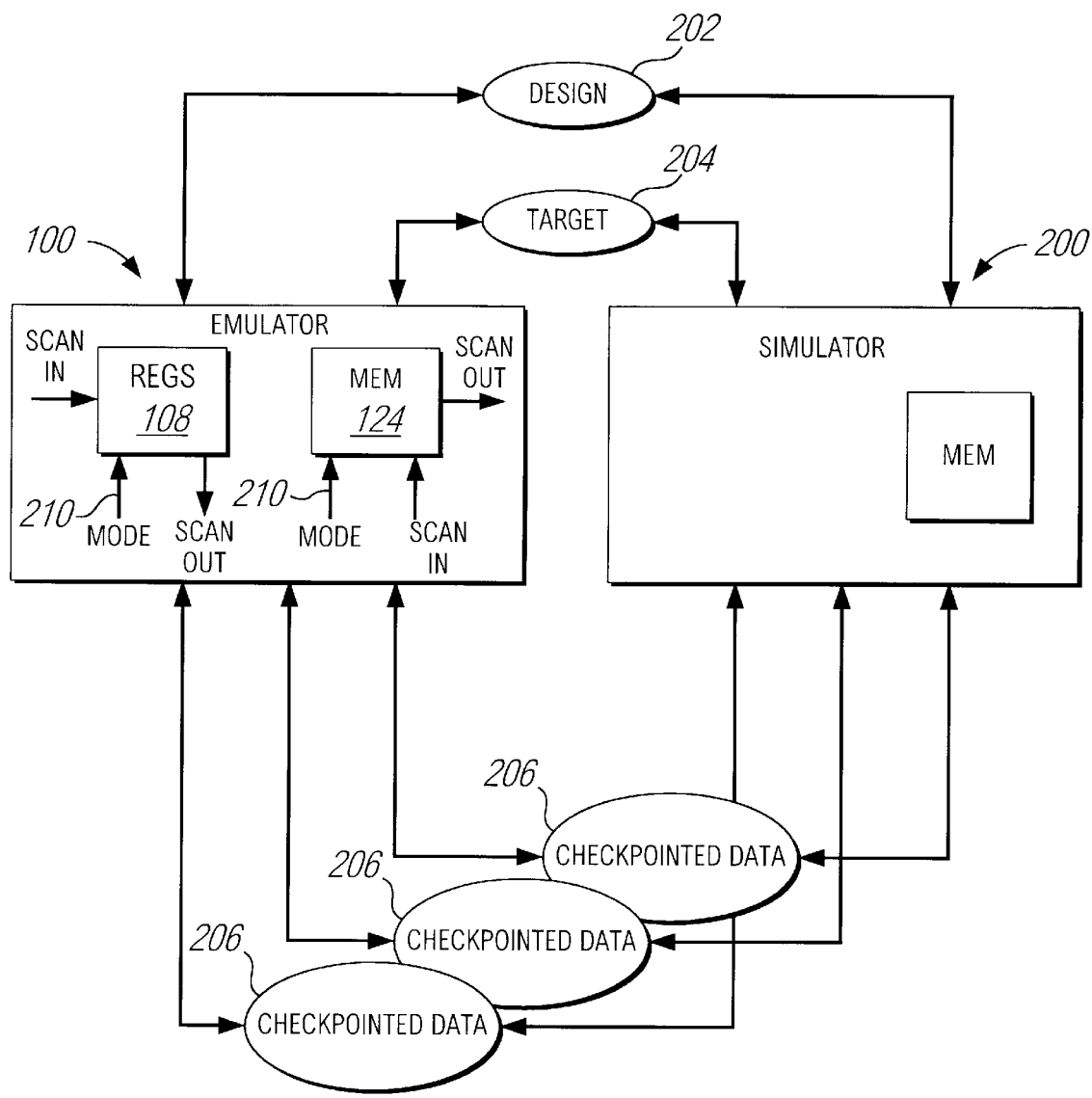
FIG. 22 is a block diagram of an emulator and simulator communicating checkpointed data in accordance with a preferred embodiment of the present invention.

The following section details how data can be checkpointed from an emulator in such a way that it can be input back to the emulator or into a simulator. FIG. 22 is a block diagram of an emulator and simulator communicating checkpointed data in accordance with a preferred embodiment of the present invention. Emulator 100 operates in a manner similar to that of emulator 100 of FIG. 1, as described above. It receives a design 202 that has been compiled as described above. During operation of emulator 100, data fills the registers 108 and memory 124 as also described above. At any time, emulator 100 can be put into a "SCAN" mode through the use of mode line 210. In SCAN mode, data currently in the registers 108 and memory 124 can be checkpointed. To "checkpoint" data is to capture the data in a predefined format and to store it for future use.

As indicated in the Figure, checkpointed data can later be used in various ways. For example, it can be read back into the emulator as "SCAN_IN" data to restart the emulator at a previous point in time. It also can be read by the simulator to enable the simulator to start simulating at the point where the emulator checkpointed the data. In a preferred embodiment, the emulator automatically enters SCAN mode periodically so that periodic records of the state of the registers and memory is retained. In other implementations, an outside source, such as a human user initiates SCAN mode.

Figure 23:
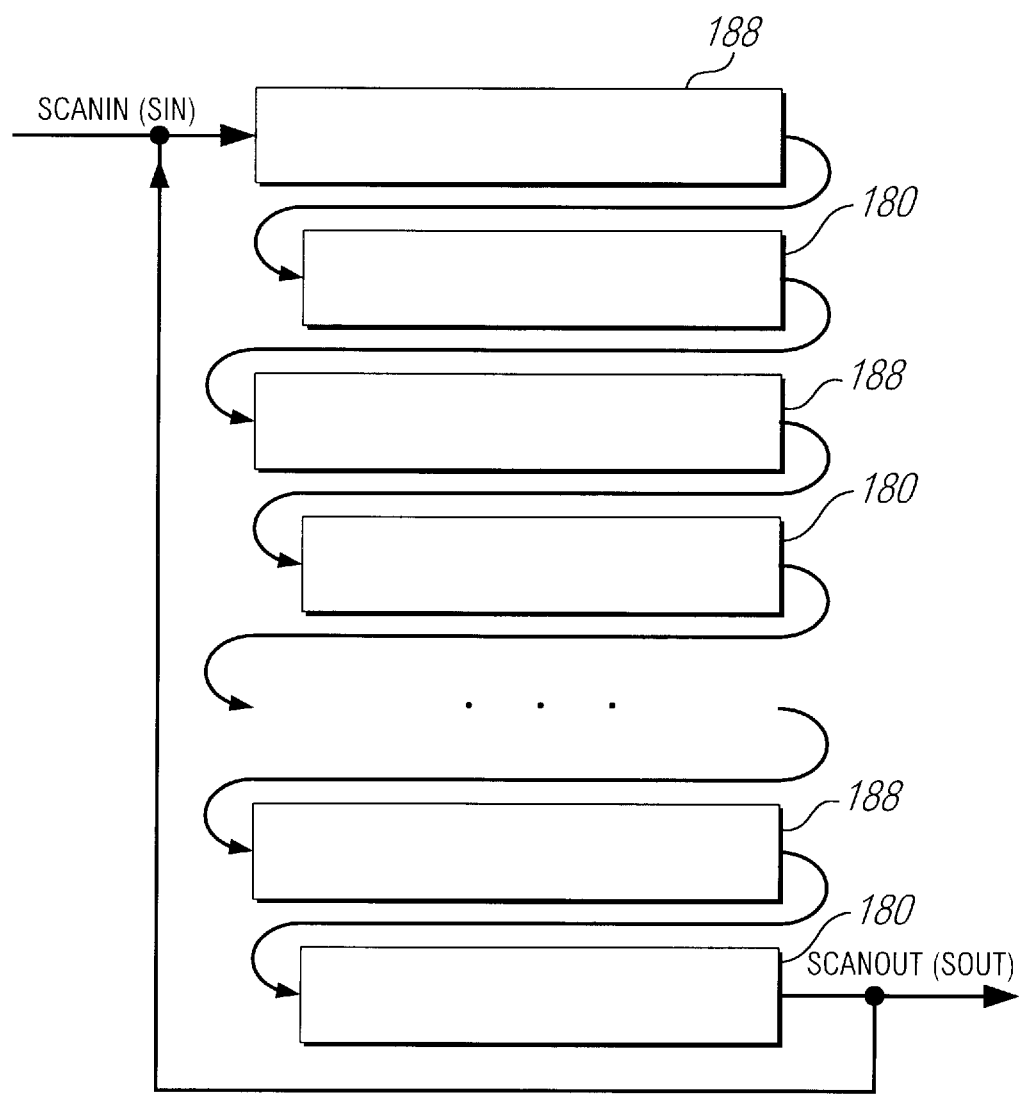
FIG. 23 is a block diagram of an order in which checkpointed data is input to and output from the registers of the emulator of FIG. 22 in accordance with a first embodiment of the present invention.

FIG. 23 is a block diagram of an order in which checkpointed data is input to and output from registers 108 of the emulator in accordance with a first embodiment of the present invention. As shown in FIG. 3A, there preferably are 256 64-bit registers 188 and 256 63-bit shadow registers 180. As shown in FIG. 23, to output checkpointed data, a one bit SCAN_OUT line outputs a bit stream representing the contents of each shift/shadow register pair. Thus, it takes (63+64)×256=32,512 cycles to clock checkpointed data out on the SCAN_OUT line from registers 108. As data is clocked out of SCAN_OUT, it is simultaneously clocked back into the shift/shadow register pairs. Thus, the checkpointing operation is non-destructive.

To reload previously checkpointed data, a one bit SCAN_IN line inputs a bit stream that replaces the contents of each shift/shadow register pair. Thus, it takes (63+64)×256=32,512 cycles to clock checkpointed data in on the SCAN_IN line. Once new data is loaded into the registers, normal operation of the emulator continues.

Figure 24:
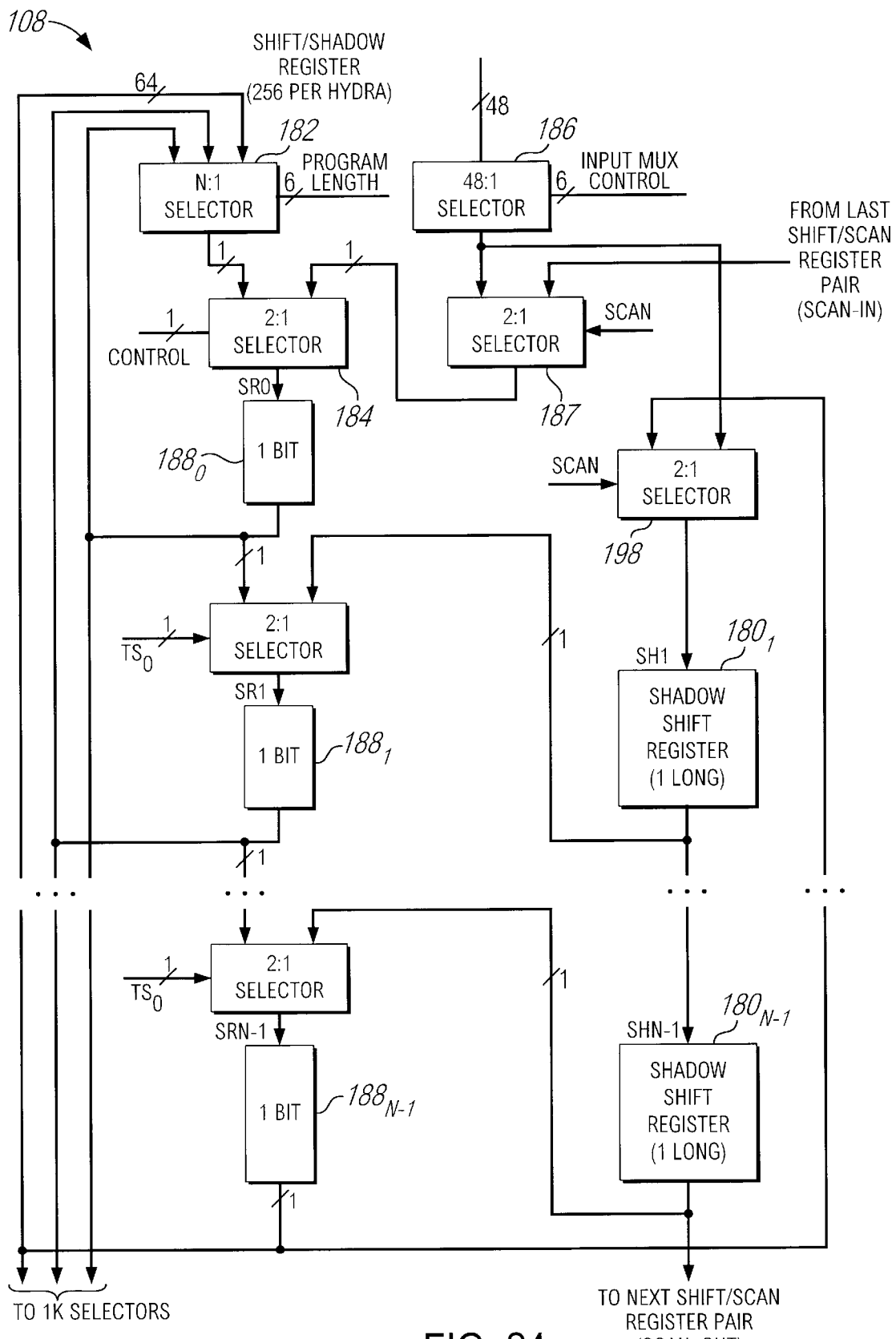
FIG. 24 is a block diagram of the registers of the emulator in accordance with the first embodiment.

FIG. 24 is a block diagram of selectors 106 and registers 108 of the emulator in accordance with the first embodiment. FIG. 24 shows multiple bits of a "shift register 188 and a "shadow" shift register 180. Together registers 188 and 180 form a single "shift/shadow register pair." There are 255 other shift/shadow register pairs in the system. FIG. 24 also shows 64:1 selector 182, 2:1 selector 184, 48:1 selector 186, 2:1 selector 187, and 2:1 selector 198.

During normal operation, as indicated by value of the SCAN line, values from 48:1 selector 186 are routed both to shadow shift register 180 and, selectively, to shift register 188 via 2:1 selector 184. Where the value from 48:1 selector 186 is a registered variable, the registered variable is copied to shadow shift register 180, only, and not to shift register 188. Instead, shift register 188 receives a value from 64:1 selector 182 which is generated during the previous program cycle so that any registered variables that change during the current program cycle are not updated until the next program cycle. 64:1 selector 182 allows values from anywhere within shift register 188 to be routed back to stage 0 of the shift register. This allows flexible access to variable values that are computed within a program cycle. The selection of variable through 64:1 selector 182 is by the six control lines shown connected to 64:1 selector 182 and which are controlled from the control data. Other control signals such as the five input multiplexer (MUX) lines to 48:1 selector 186 and single control line to 2:1 selector 184 also issue from the control data.

During checkpointing, the SCAN line is set to a predetermined value, either automatically or by a human operator. When the SCAN line indicates SCAN mode, then 2:1 selector 187 selects input from the 255th shift/shadow register pair. At subsequent scan_clock cycles (not shown), each bit of shift register 188 is shifted to the next bit of register 188. The last bit of register 188 is shifted into the first bit of shadow register 180 via 2:1 selector 198. The last bit of shadow register 180 is shifted into the first bit of the next shift/shadow register pair. The last bit of the last shift shadow register pair is shifted out on a SCAN_OUT line (not shown) and is also shifted into the first bit of the first shift register 180, via selector 187. Thus, a checkpointing operation is non-destructive, since the bits shifted out on SCAN_OUT are also shifted back into the shift/shadow register pairs.

To read checkpointed data back into the system, 2:1 selector 187 selects input from the SCAN_IN data stream. At subsequent scan_clock cycles (not shown), each bit of shift register 188 is shifted to the next bit of register 188. The last bit of register 188 is shifted into the first bit of shadow register 180. The last bit of shadow register 180 is shifted into the first bit of the next shift/shadow register pair. The last bit of the last shift shadow register pair is shifted out on a SCAN_OUT line (not shown) and is also shifted into the first bit of the first shift register 180, via selector 187. Once all values have been loaded into each shift/shadow register pair, normal operation can continue using the newly loaded values.

Figure 25:
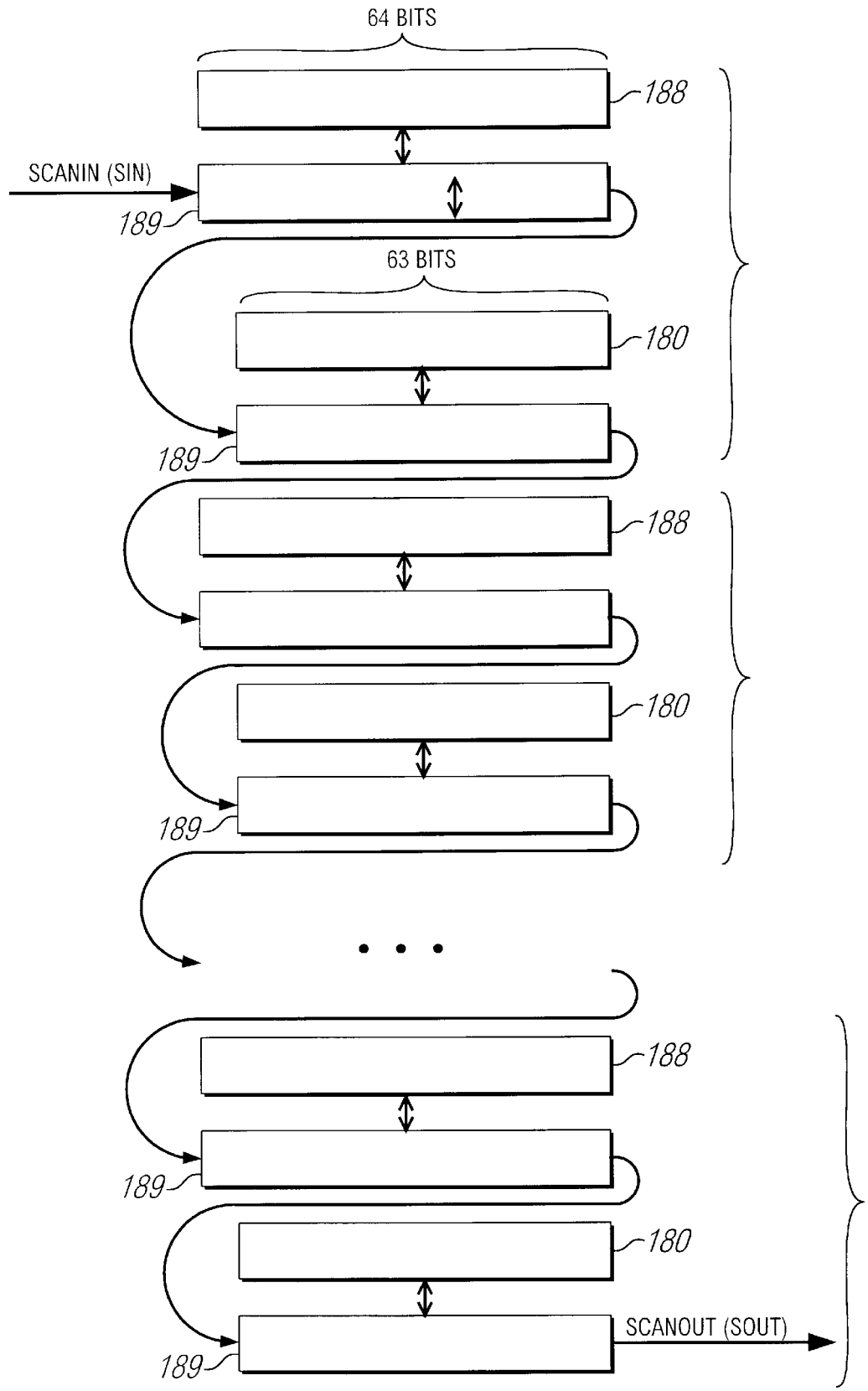
FIG. 25 is a block diagram of an order in which checkpointed data is input to and output from the registers of the emulator of FIG. 22 in accordance with a second embodiment of the present invention.

FIG. 25 is a block diagram of an order in which checkpointed data is input or output from the registers of the emulator in accordance with a second embodiment of the present invention. As discussed above in connection with FIGS. 3A and 24, the described embodiment preferably includes 256 64 bit registers and 256 63 bit shadow registers. FIG. 25 shows a second embodiment of the invention in which each shift register 188 and each shift shadow register 180 has its own checkpointing register 189 that holds duplicate data. During normal operation, each time a value is input to either a bit of the shift register 188 or into a bit of the shadow shift register 180, a corresponding checkpointing register 189 also receives the bit. During checkpointing, however, the input to the shift/shadow register pairs is not input to checkpointing register 189. Instead, the contents of checkpointing registers 189 can be shifted out on the one bit SCAN_OUT line. Thus, the checkpointing registers 189 "freeze" and save the contents of the registers 180 and 188 during checkpointing so that the emulator can continue normal operation at the same time that checkpointing is occurring. Thus, while it still takes (63+64)×256=32,512 cycles to clock checkpointed data out on the SCAN_OUT line, the emulator can continue in normal operation during checkpointing. During SCAN mode, as data is clocked out of SCAN_OUT, some implementations simultaneously clocked the checkpointed data back into the checkpointing registers 189.

To reload previously checkpointed data, a one bit SCAN_IN line inputs a bit stream that replaces the contents of each checkpointing register 189. Thus, it takes (63+64)×256=32,512 cycles to clock checkpointed data into the checkpointing registers 189 on the SCAN_IN line. Once new data is loaded into the checkpointing registers 189, the data is clocked into each shift/shadow register pair in a single cycle and normal operation of the emulator continues. In an alternative embodiment of the present invention, the system could simply clock the checkpointed data into the shift/shadow register pairs.

Figure 26:
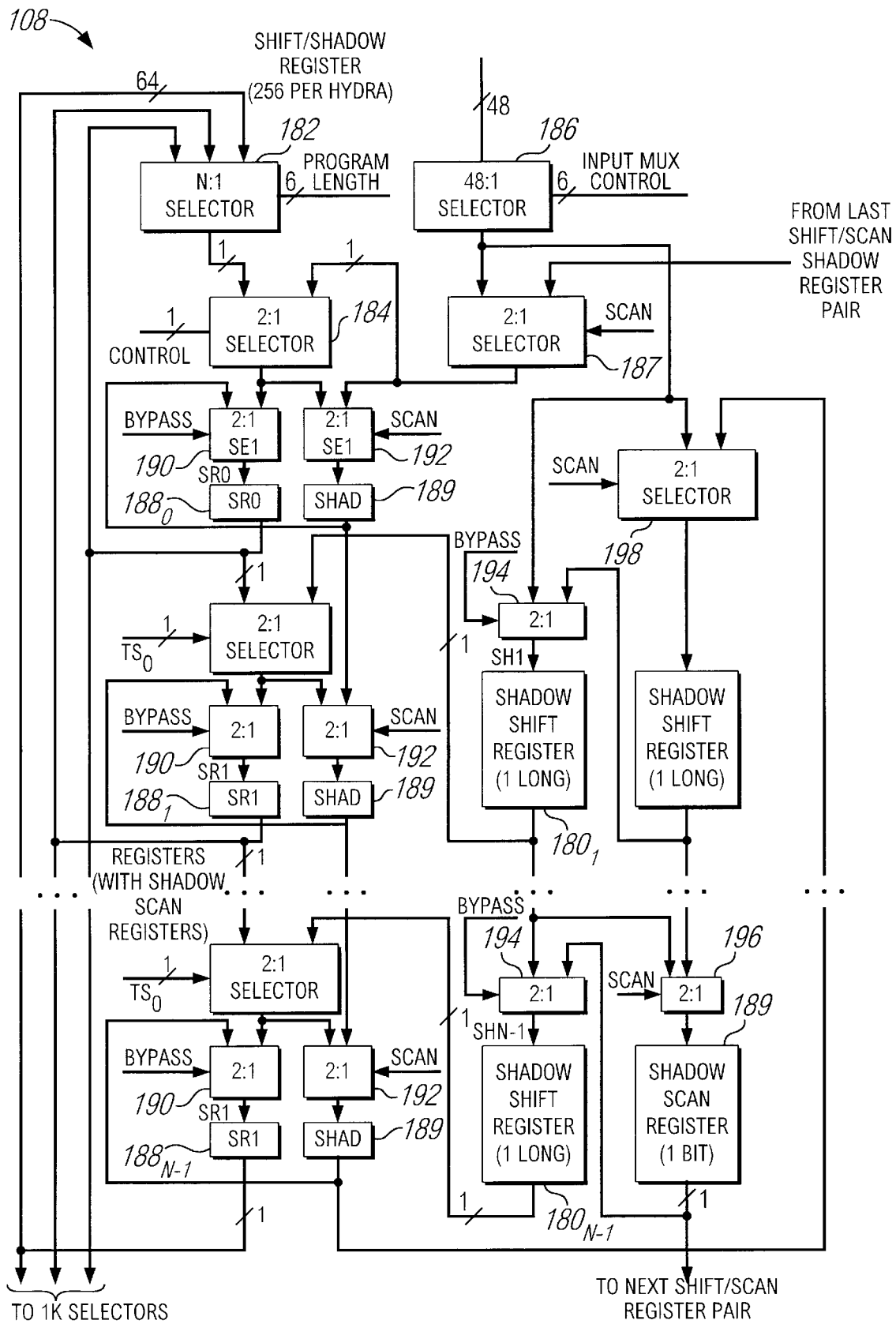
FIG. 26 is a block diagram of the registers of the emulator in accordance with the second embodiment.

FIG. 26 is a block diagram of the registers of the emulator in accordance with the second embodiment of FIG. 25. FIG. 26 shows multiple bits of a "shift" register 188 and a "shadow" shift register 180. Together registers 188 and 180 form a single "shift/shadow register pair." FIG. 26 also shows bits of two checkpointing registers 189, one for shift register 188 and one for shadow register 180. There are 255 other shift/shadow register pairs in the system, each having their own checkpointing registers 189. FIG. 26 also shows 64:1 selector 182, 2:1 selector 184, 48:1 selector 186 and 2:1 selector 187, as shown in FIG. 24. In addition, FIG. 26 shows a 2:1 selector 190 for each bit of shift register 188, a 2:1 selector 192 for each bit of checkpointing register 189, a 2:1 selector 194 for each bit of shadow register 180 and a 2:1 selector 196 for each bit of checkpointing register 189.

During normal mode, input to shift register 188 from selector 184 is also input to shadow register via selectors 190 and 192.

During checkpointing, the contents of all checkpointing registers 189 are shifted out through SCAN_OUT in a manner similar to that described in connection with FIG. 24. The last bit of the last checkpointing register 189 is shifted out on a SCAN_OUT line (not shown) and is also shifted into the first bit of the first shift register 180, via selector 187. Normal operation of the emulator can continue during checkpointing, since the values at the beginning of the checkpointing operation are "frozen" in checkpointing registers 189 at the beginning of the operation.

To read checkpointed data back into the system, 2:1 selector 187 selects input from the SCAN_IN data stream. At subsequent scan_clock cycles (not shown), each bit of checkpointing registers 189 is shifted to the next bit of registers 189. The last bit of register 189 for register 188 is shifted into the first bit of checkpointing register 189 for shadow register 180. The last bit of checkpointing register 189 for shadow register 180 is shifted into the first bit of the checkpointing registers 189 for the next shift/shadow register pair. Once all bits have been loaded into the checkpointing registers 189 for each of the 256 shift/shadow register pairs, the BYPASS line is activated and the values from registers 189 are shifted into respective registers 188 and 180. Once all values have been loaded into each shift/shadow register pair, normal operation can continue using the newly loaded values.

Figure 27:
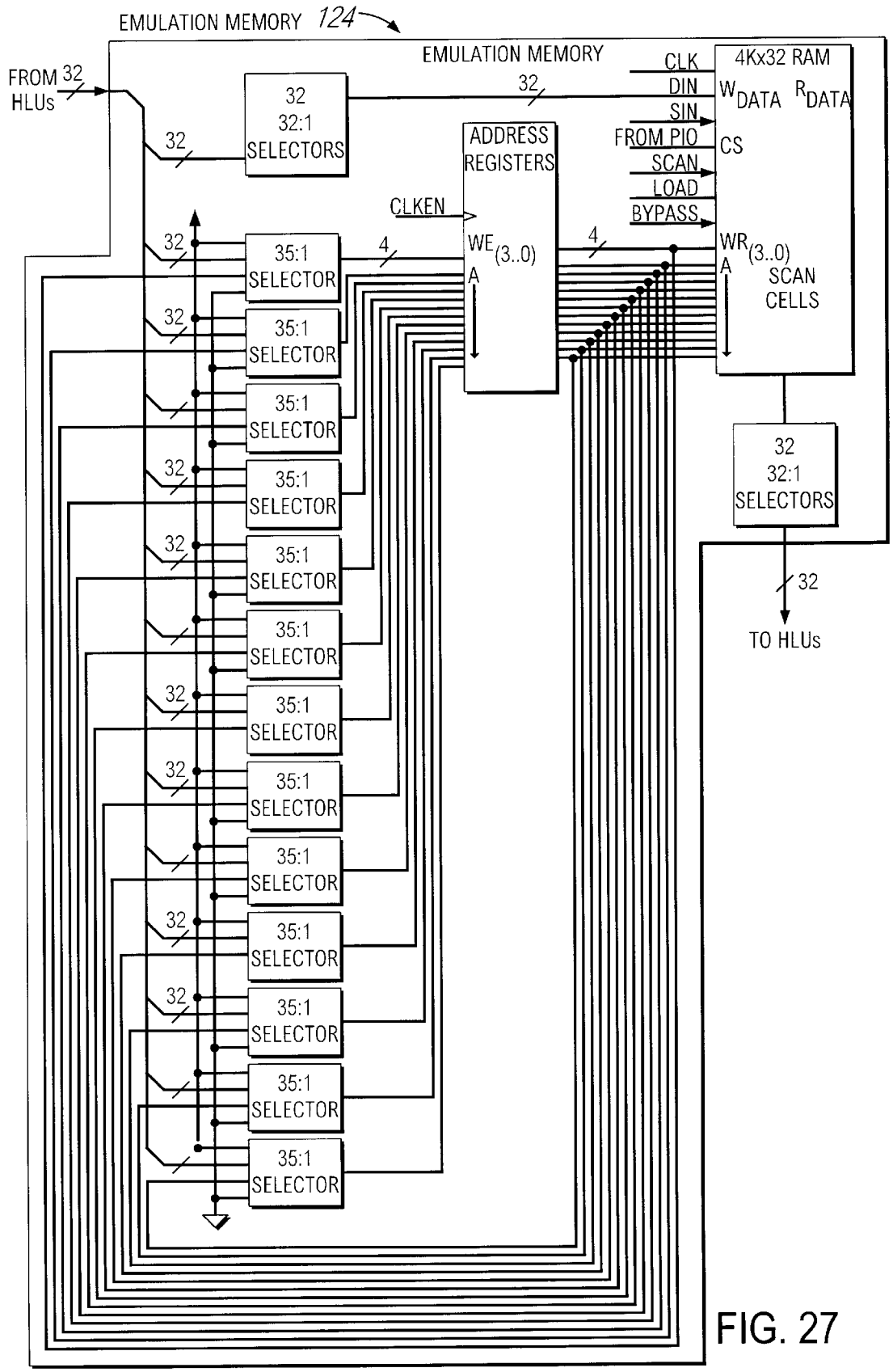
FIG. 27 is a block diagram of an emulation memory of the emulator.
Figure 28:
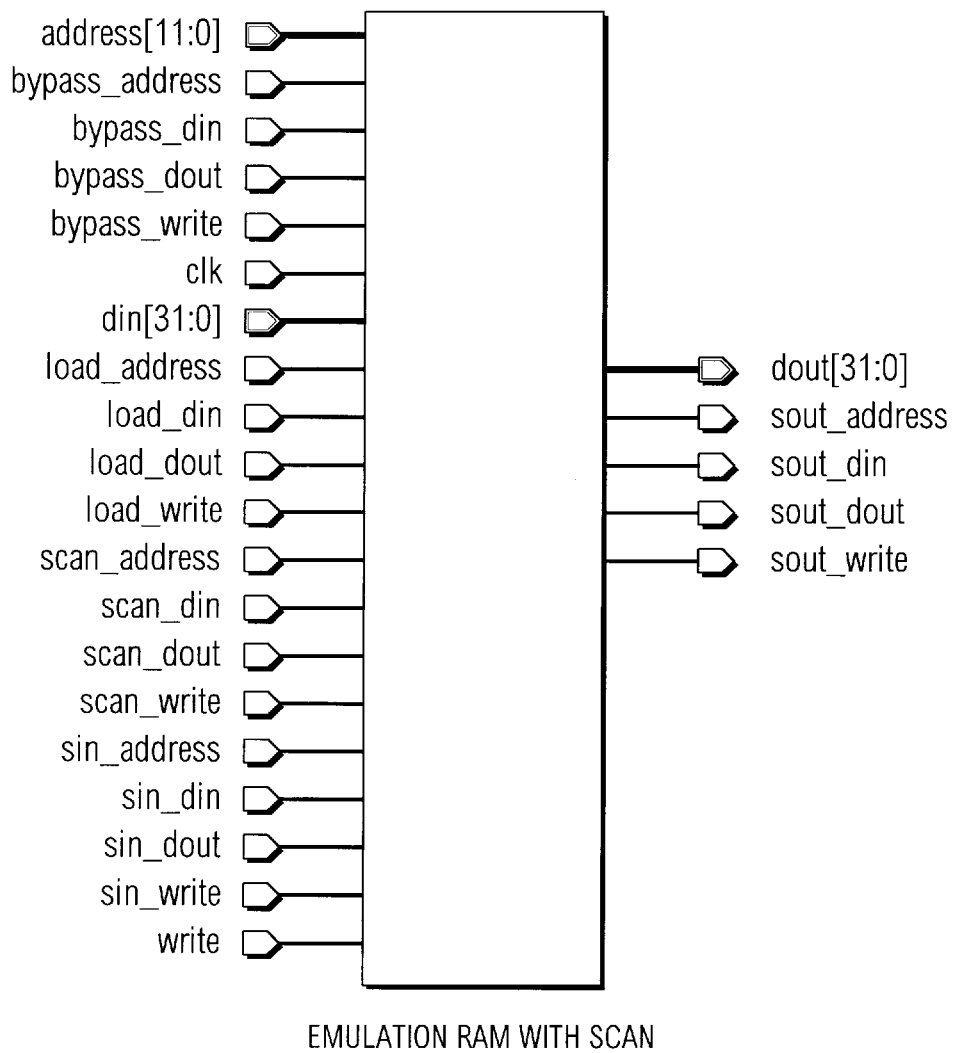
FIGS. 28–45 are diagrams showing various details of the emulation memory of FIG. 27.
Figure 29:
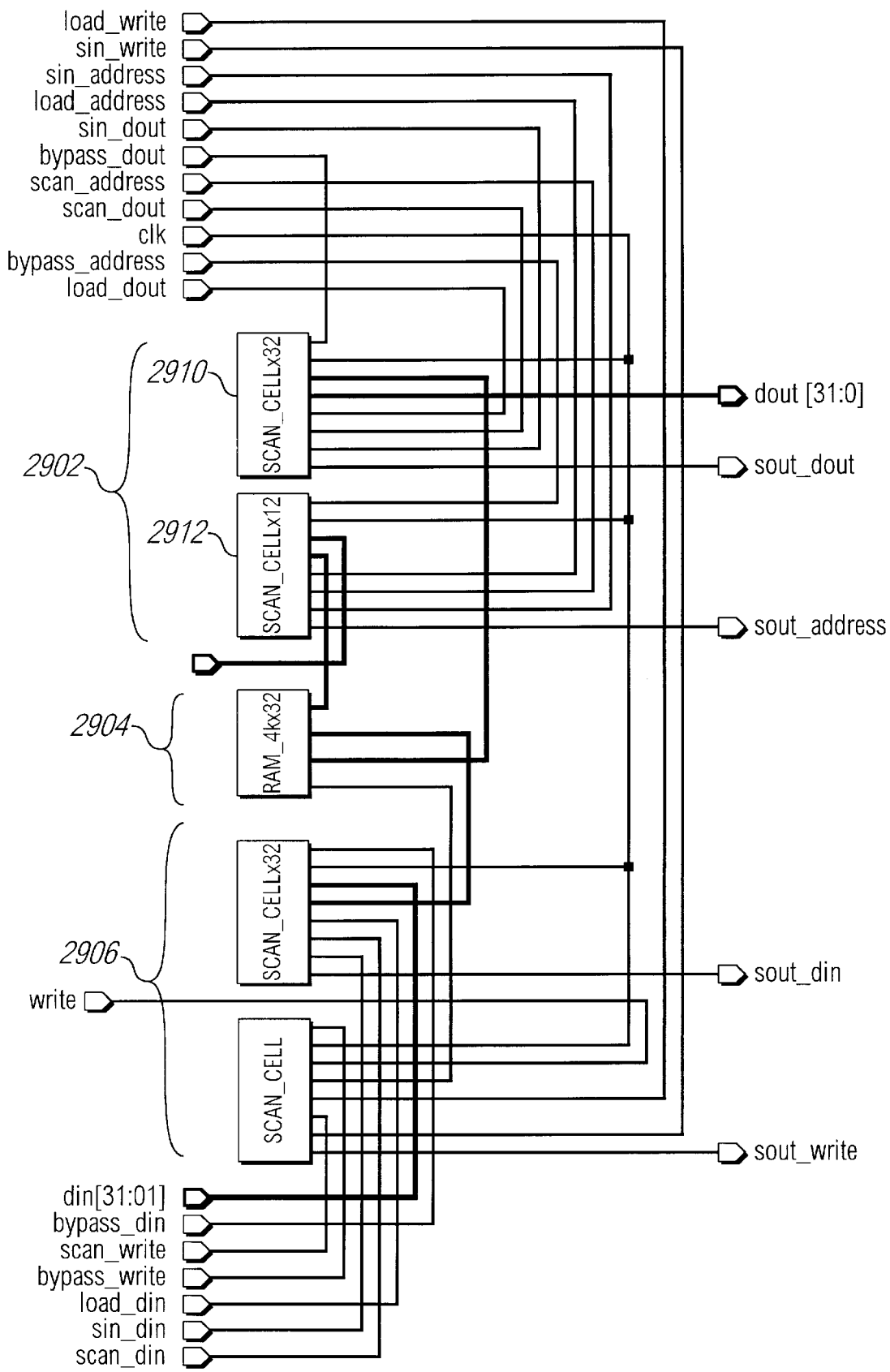

FIG. 27 is a block diagram of 4K×32 emulation memory 124 of the emulator. FIGS. 28–45 are diagrams showing various details of emulation memory 124. FIG. 28 shows details of the input and output lines of the emulation memory. FIG. 29 shows additional detail of the emulation memory. As shown in FIG. 29, the emulation memory includes a first plurality of scan cells 2902, a 4k×32 RAM 2904, and a second plurality of scan cells 2906. Scan cells 2906 control the writing and loading of data into the emulation memory. This data may be either 32-bit write data or 1-bit load data that was previously checkpointed. Scan cells 2902 control the reading and checkpointing of data from the emulation memory. This data may be either 32-bit read data or 1-bit checkpointed data.

Figure 30:
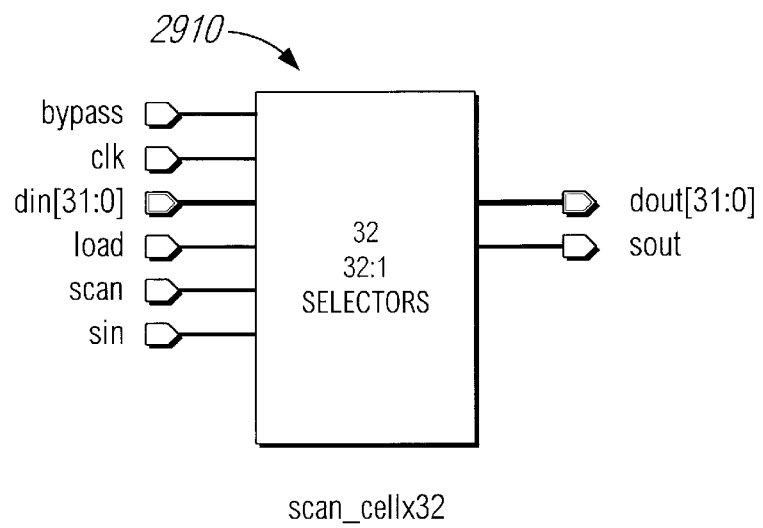
Figure 31:
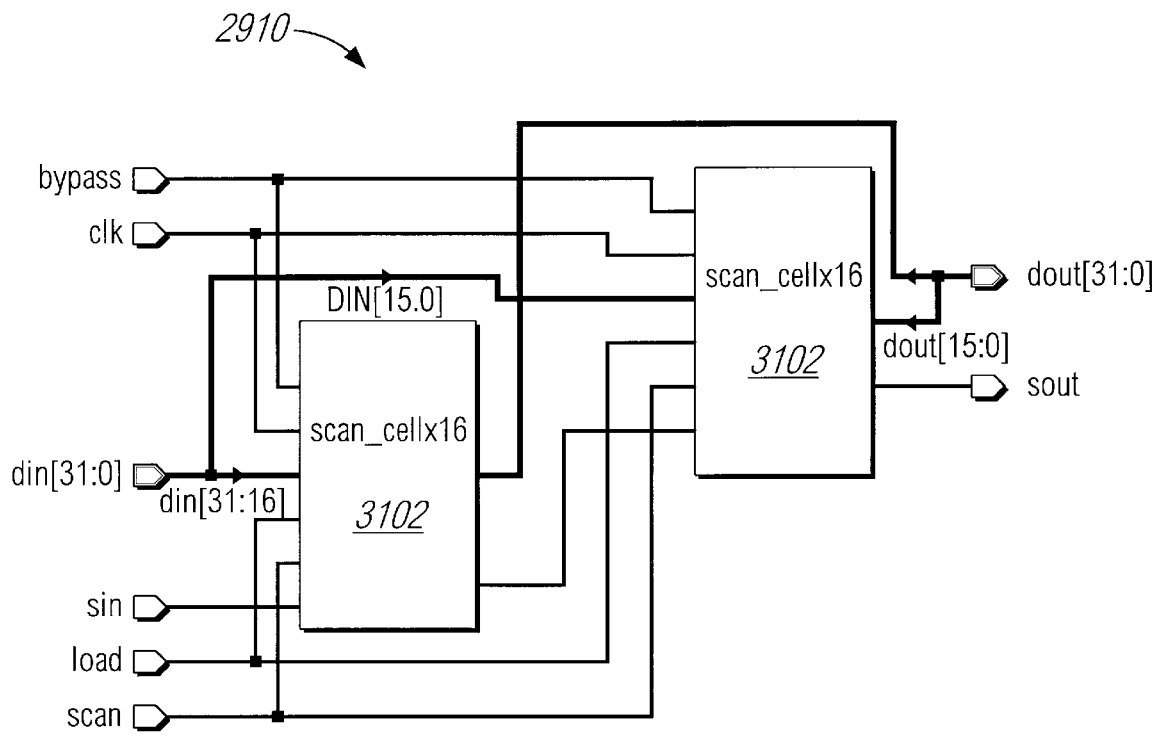
Figure 32:
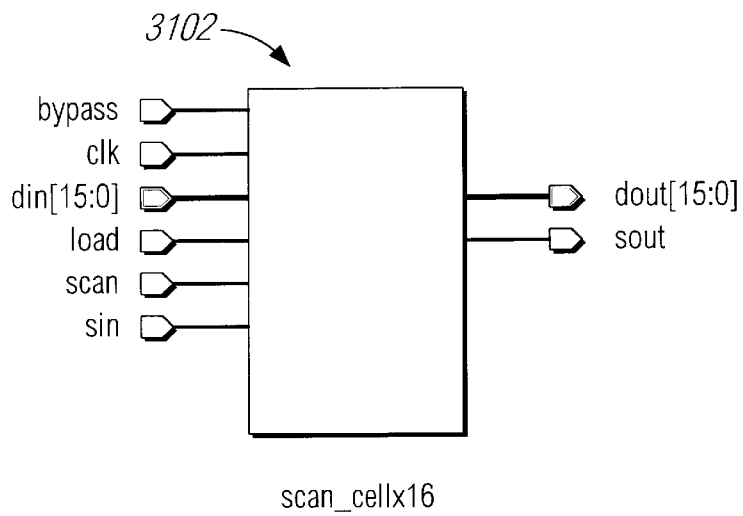
Figure 33:
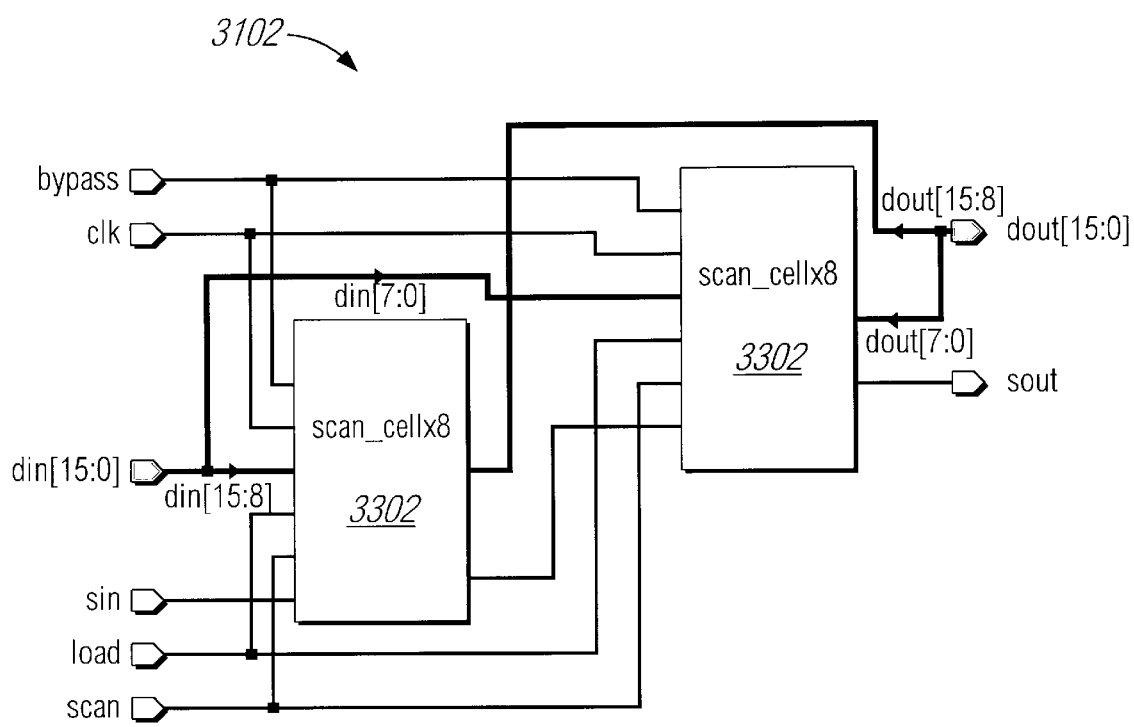
Figure 34:
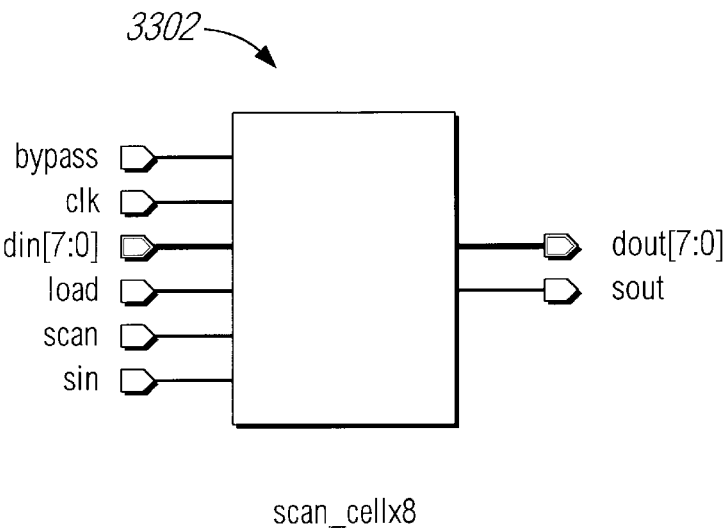
Figure 35:
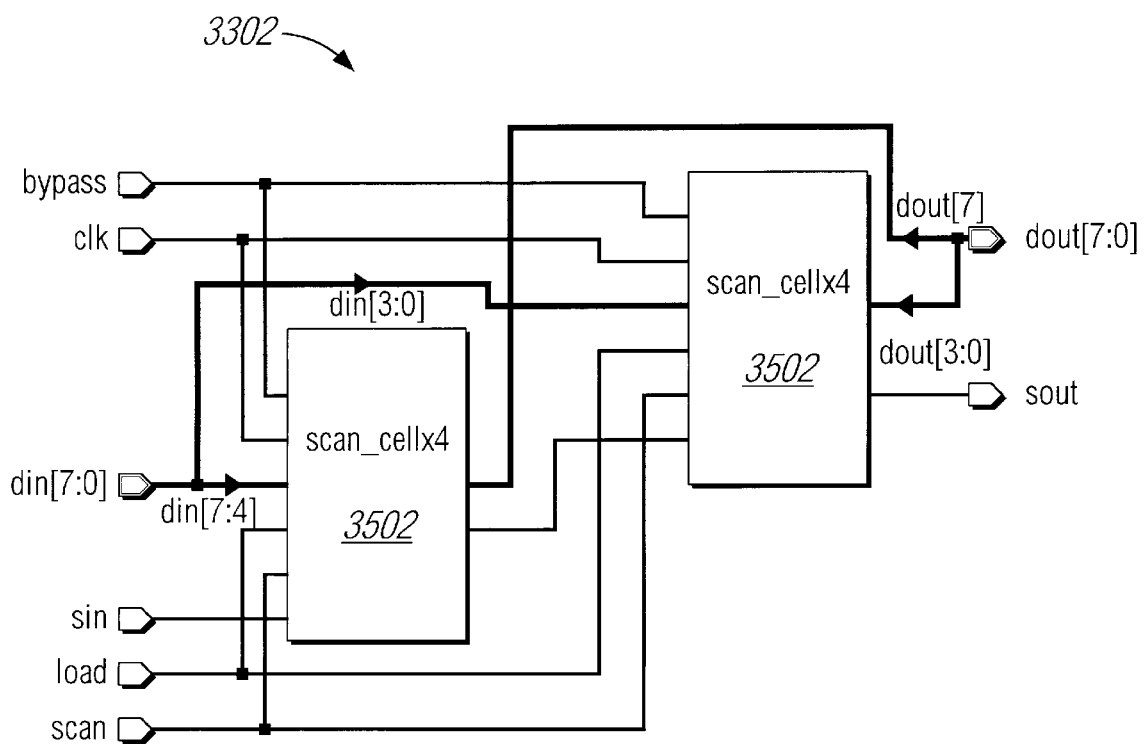
Figure 36:
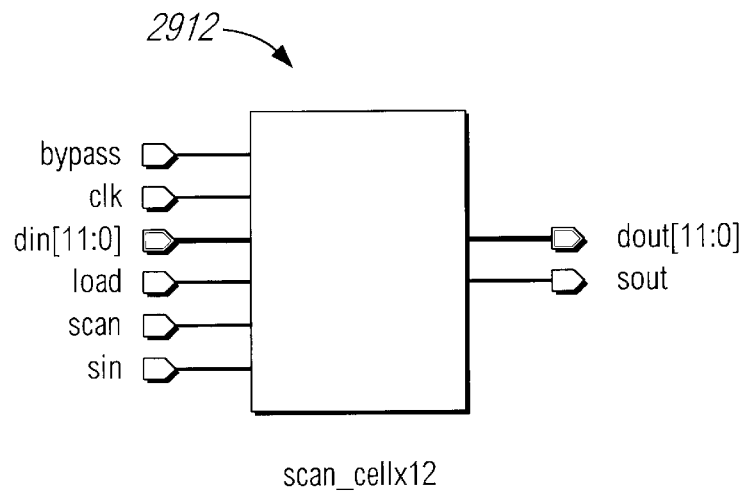
Figure 37:
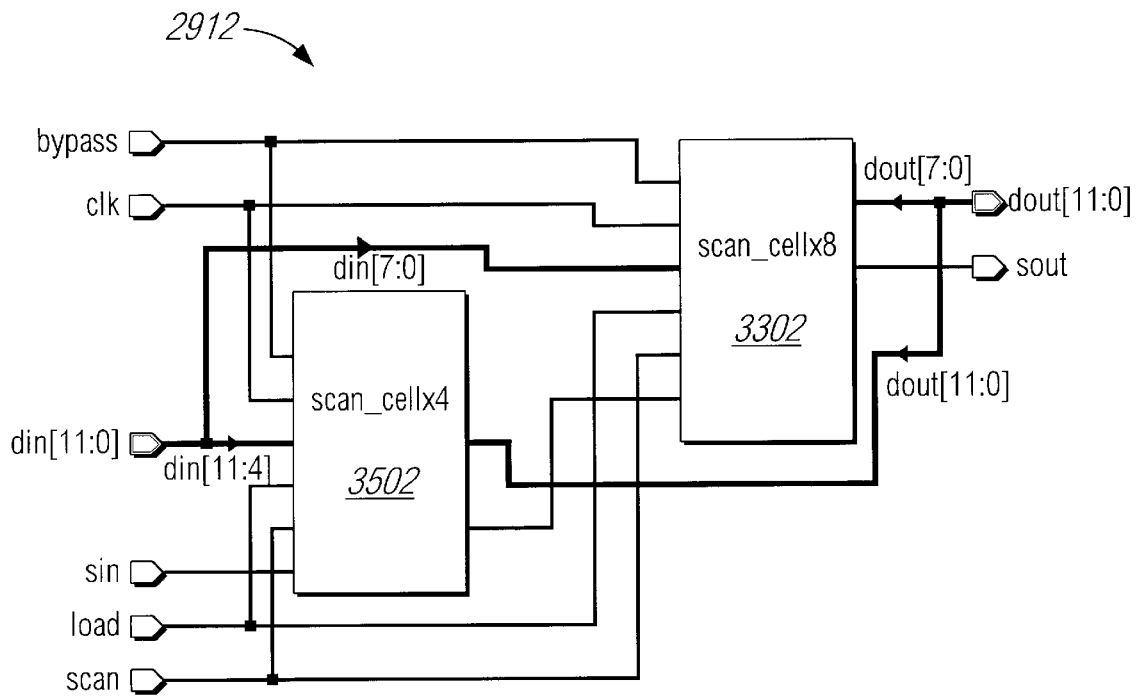
Figure 38:
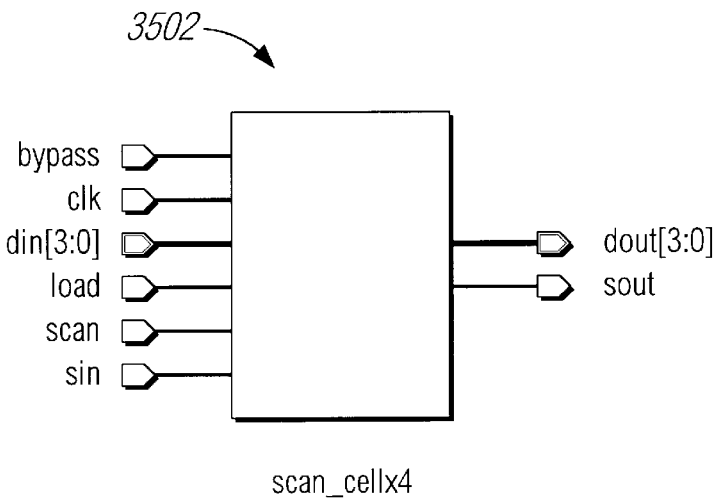
Figure 39:
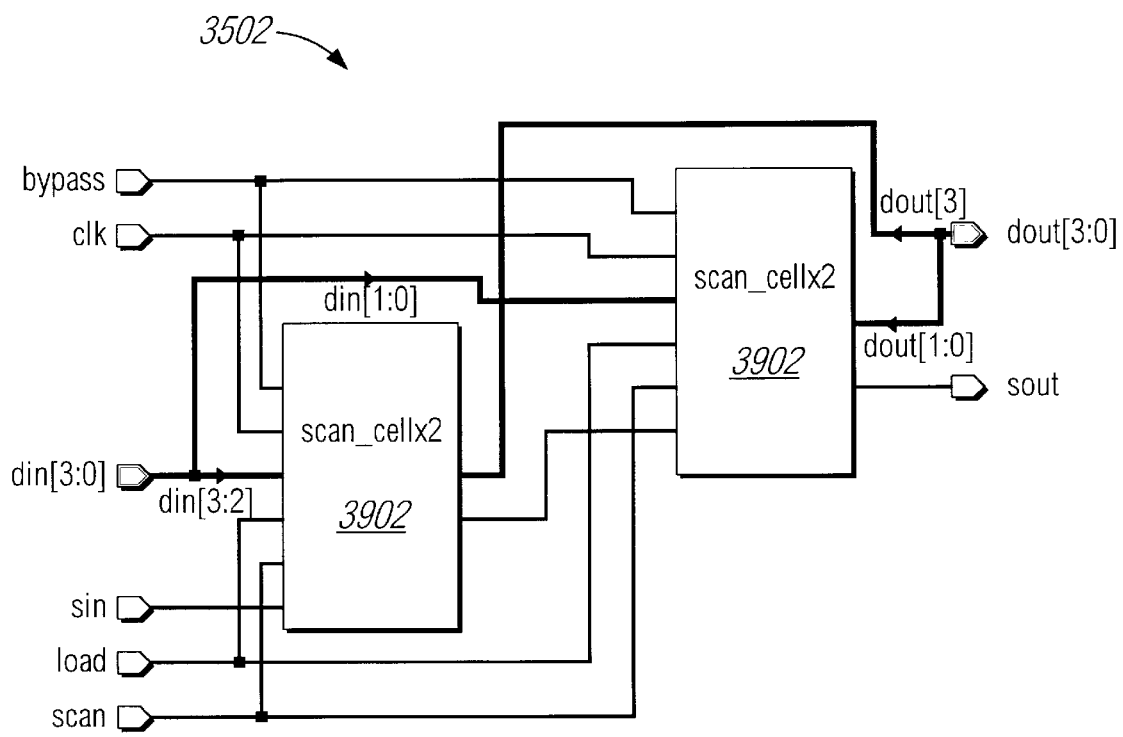
Figure 40:
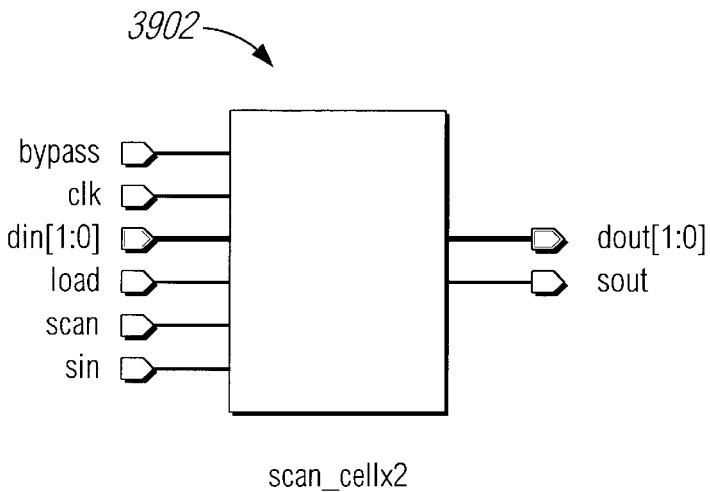
Figure 41:
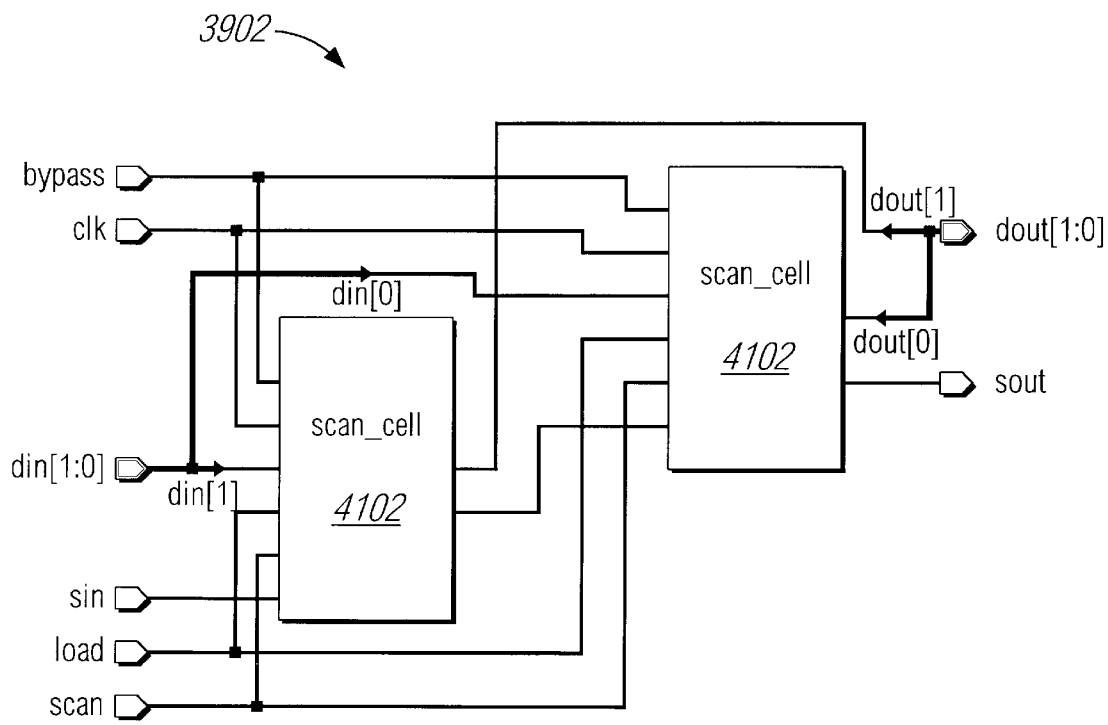
Figure 42:
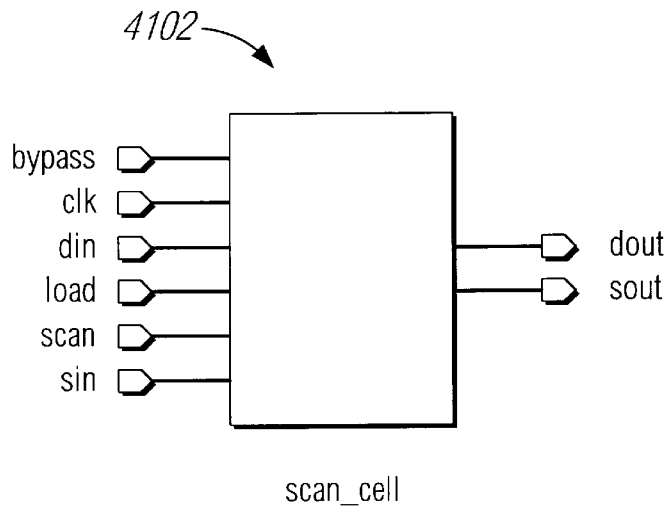
Figure 43:
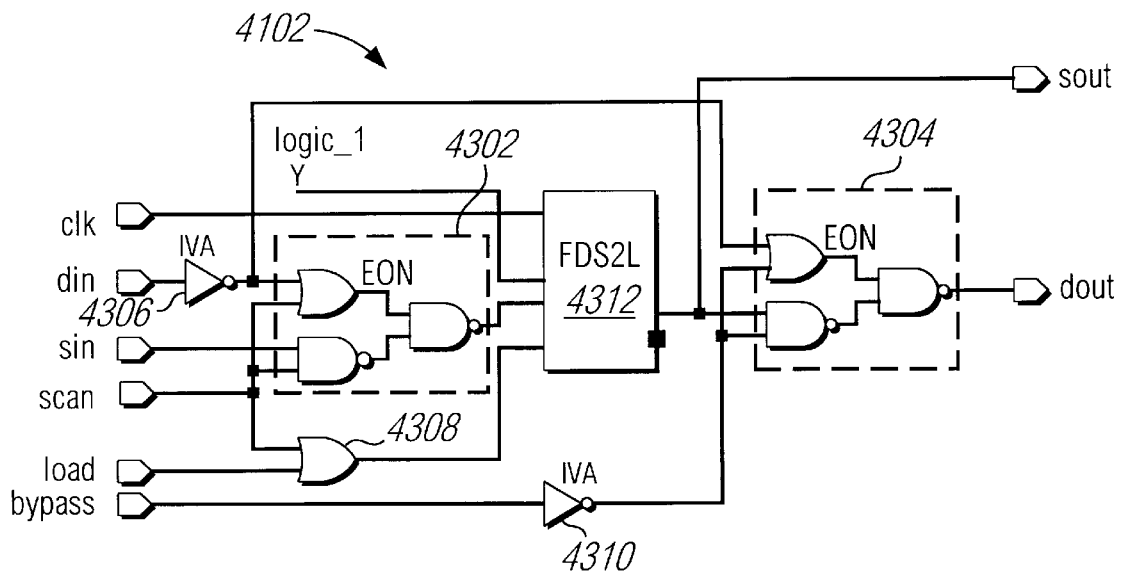

FIGS. 30 and 31 show details of a 32 bit scan cell 2910 of FIG. 29. Scan cell 2910 includes two scan cells 3102. FIGS. 32 and 33 show details of 16-bit scan cell 3102 of FIG. 31. Scan cell 3102 includes two scan cells 3302. FIGS. 34 and 35 show details of an 8-bit scan cell 3302 of FIGS. 33 and 37. Scan cell 3302 includes two scan cells 3502. FIGS. 36 and 37 show details of a 12-bit scan cell 2912 of FIG. 29. Scan cell 2912 includes a scan cell 3302 (see FIGS. 34 and 35) and a scan cell 3502. FIGS. 38 and 39 show details of 4-bit scan cell 3502 of FIGS. 35 and 37. Scan cell 3502 includes two scan cells 3902. FIGS. 40 and 41 show details of 2-bit scan cell 3902 of FIG. 39. Scan cell 3902 includes two scan cells 4102. FIGS. 42 and 43 show details of single bit scan cell 4102 of FIG. 41. Scan cell 4102 includes a first selector 4302, a second selector 4304, a first inverter 4306, an OR gate 4308, a second inverter 4310, and a D-type flip flop 4312.

Figure 44:
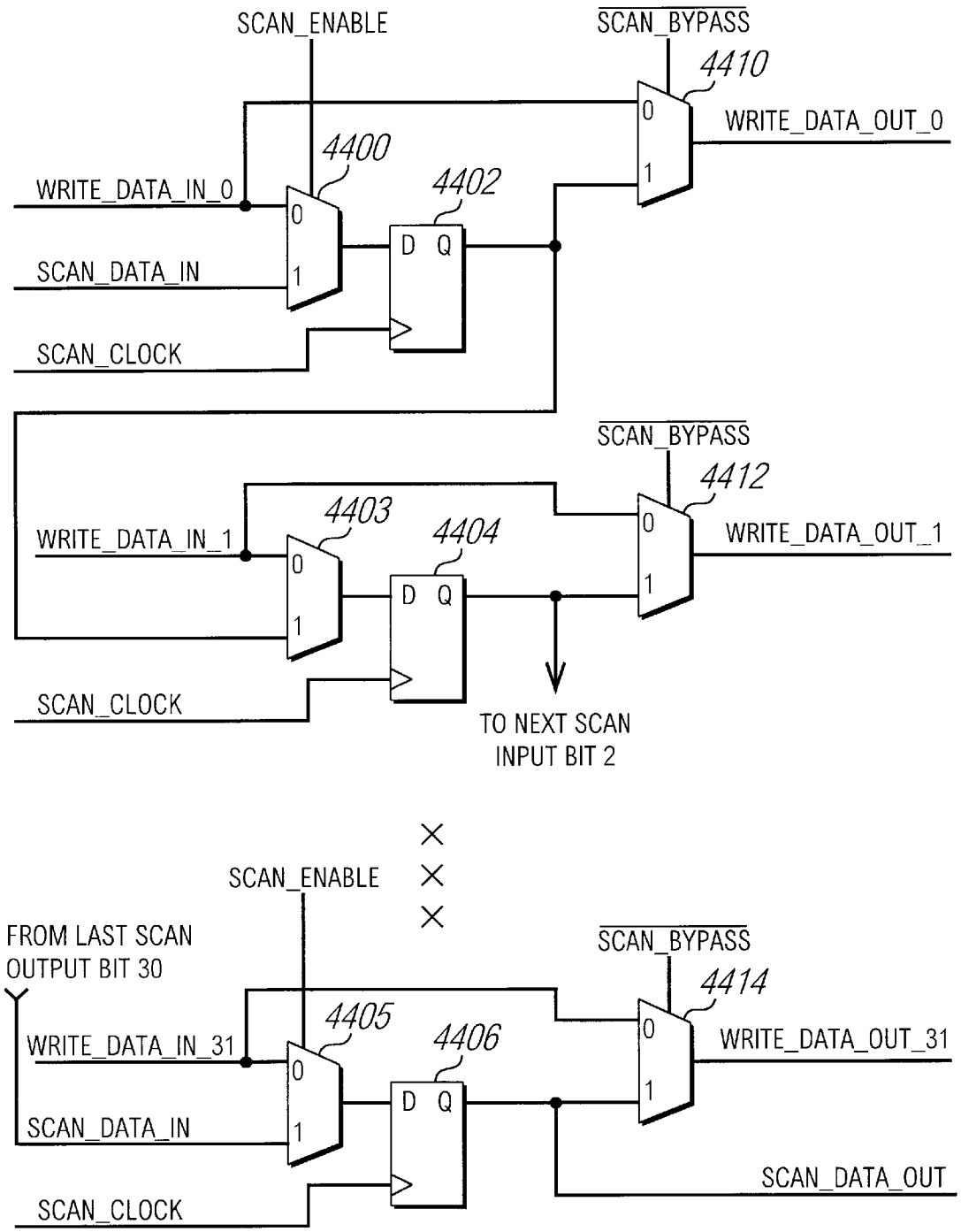

FIG. 44 is a block diagram showing several write scan cells connected together in a preferred embodiment of the present invention. A first flip flop 4402 receives from a selector 4400 either a first bit of the 32 bit WRITE data (Write_data_in_0) or a bit from the SCAN_IN line (scan_data_in), depending on a value of the scan_enable line. Selector 4410 receives the WRITE bit and the output of flip flop 4402 and outputs one of them in accordance with a SCAN_BYPASS line that controls when data is written to the RAM. In the described embodiment, data is not written to RAM while previously checkpointed data is being scanned into the san cells. Other implementations may omit the bypass line. The output of flip flop 4402 also is input to a selector 4403, which sends to second flip flop 4404 either a second bit of the 32 bit Write data (Write_data_1) or the output of flip flop 4402, depending on a value of the scan_enable line. Selector 4412 receives the WRITE bit and the output of flip flop 4404 and outputs one of them in accordance with the SCAN_BYPASS line. The output of a thirty-first flip flop (not shown) is input to a selector 4405, which sends to thirty-second flip flop 4406 either a thirty-second bit of the 32 bit WRITE data (Write_data 31) or the input from the thirty-first flip flop, depending on a value of the scan-enable line. Selector 4414 receives the WRITE bit and the output of flip flop 4406 and outputs one of them in accordance with the SCAN_BYPASS line. Thus, during a normal write, each of the 32 flip flops 4402 through 4406 outputs a respective bit of the 32-bit WRITE data. During a checkpointing operation, it takes 32 cycles to fill the 32 flip flops 4402 through 4406. The data is clocked out of Write port 2700 on scan_data_out in accordance with the SCAN_CLOCK line.

Figure 45:
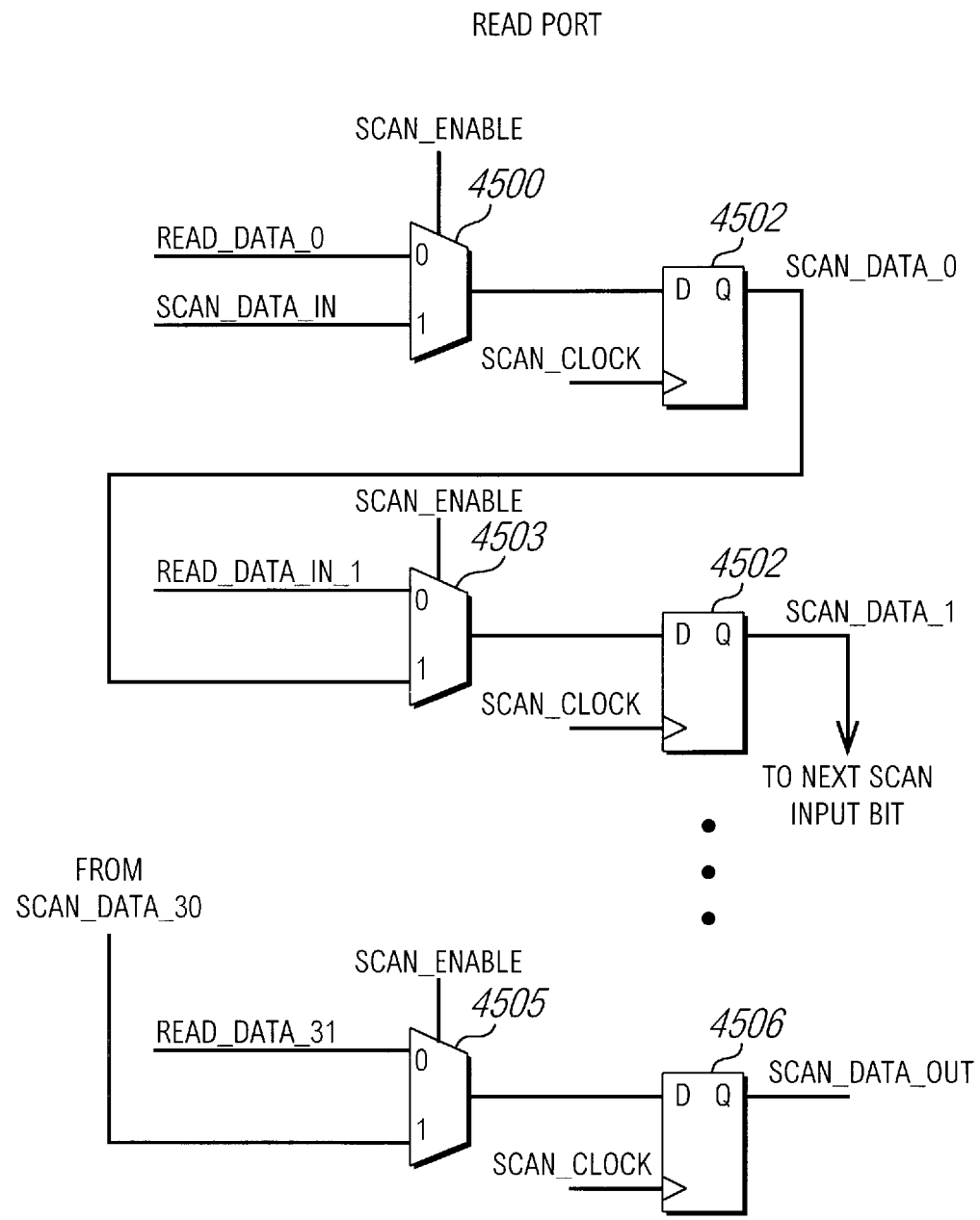

FIG. 45 is a block diagram showing several read scan cells connected together in a preferred embodiment of the present invention. A first flip flop 4502 receives from a selector 4500 either a first bit of the 32 bit READ data (Read_data_0) or a bit from the SCAN_IN line (scan_data_in), depending on a value of the scan_enable_line. The output of flip flop 4502 is input to a selector 4503, which sends to second flip flop 4504 either a second bit of the 32 READ data (Read_data 1) or the output of flip flop 4502, depending on a value of the scan_enable line.

The output of a thirty-first flip flop (not shown) is input to a selector 4505, which sends to thirty-second flip flop 4506 either a thirty-second bit of the 32 READ data (Read_data_31) or the input from the thirty-first flip flop, depending on a value of the scan_enable line. During a normal read, each of the 32 flip flops 4502 through 4506 also outputs a respective bit of the READ data. During a checkpointing operation, it takes 32 cycles to fill the 32 flip flops 4502 through 4506. The data is clocked out of read port 2702 in accordance with the SCAN_CLOCK line. Other implementations of the present invention may use a bypass line, as shown in FIG. 44.

Figure 48:
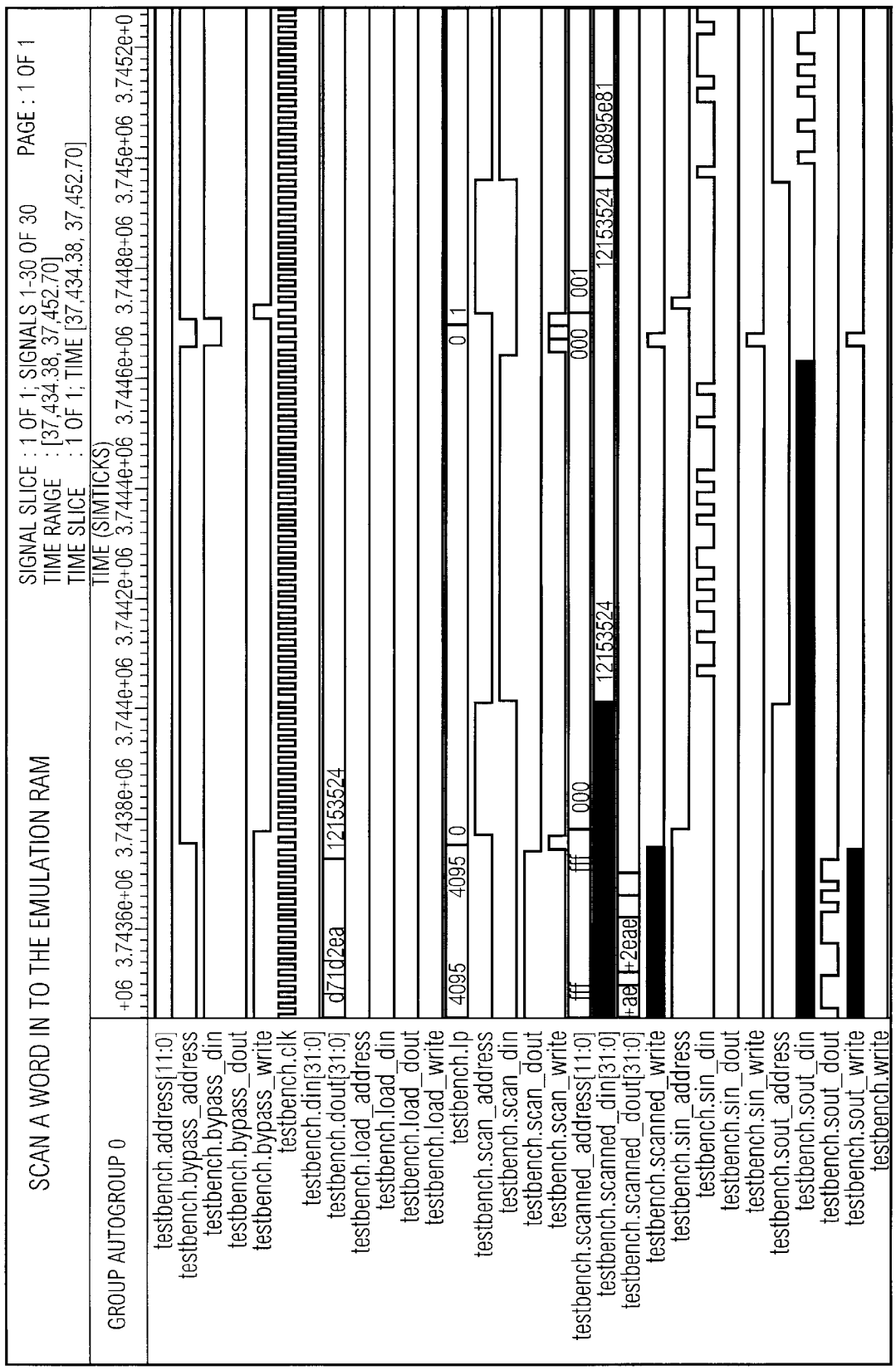
FIGS. 48 and 49 are, respectively, timing diagrams showing a scan-in operation and a scanout operation of the emulation memory.
Figure 49:
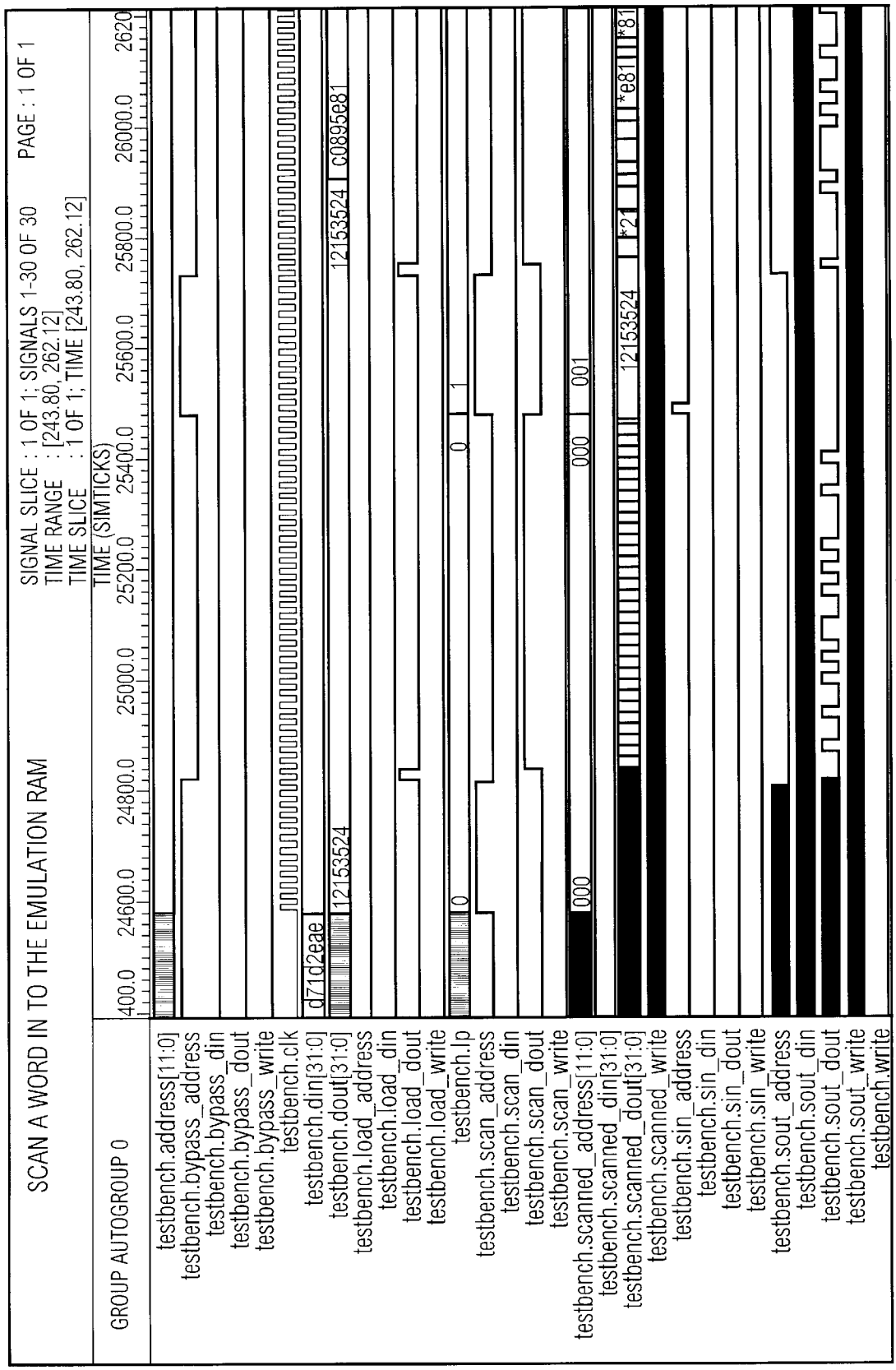

FIGS. 48 and 49 are, respectively, timing diagrams showing a scanin operation and a scanout operation of the emulation memory of FIG. 27. In general, the signal lines of FIGS. 27–45 are as follows: a clk line is a clock; a din line is 32-bit data_in line used in a write operation; an sin line is a 1-bit scan_data in line for data to be loaded into the emulation memory; a scan line indicates a scan mode in which data is checkpointed out of the emulation memory; a load line indicates a load mode in which previously checkpointed data is scanned into the emulation memory; a bypass line indicates a bypass mode in which, once data has been loaded into the scan cells, the data is loaded into the emulation memory in a single cycle; a 32-bit data line is data output from the emulation memory during a read operation; an sout line is a 1-bit scan-out line for data being checkpointed from the emulation memory.

Scan cells 2906 of FIG. 29 (read/checkpoint) are arranged similarly to scan cells 2902 and will not be described in detail.

Figure 46:
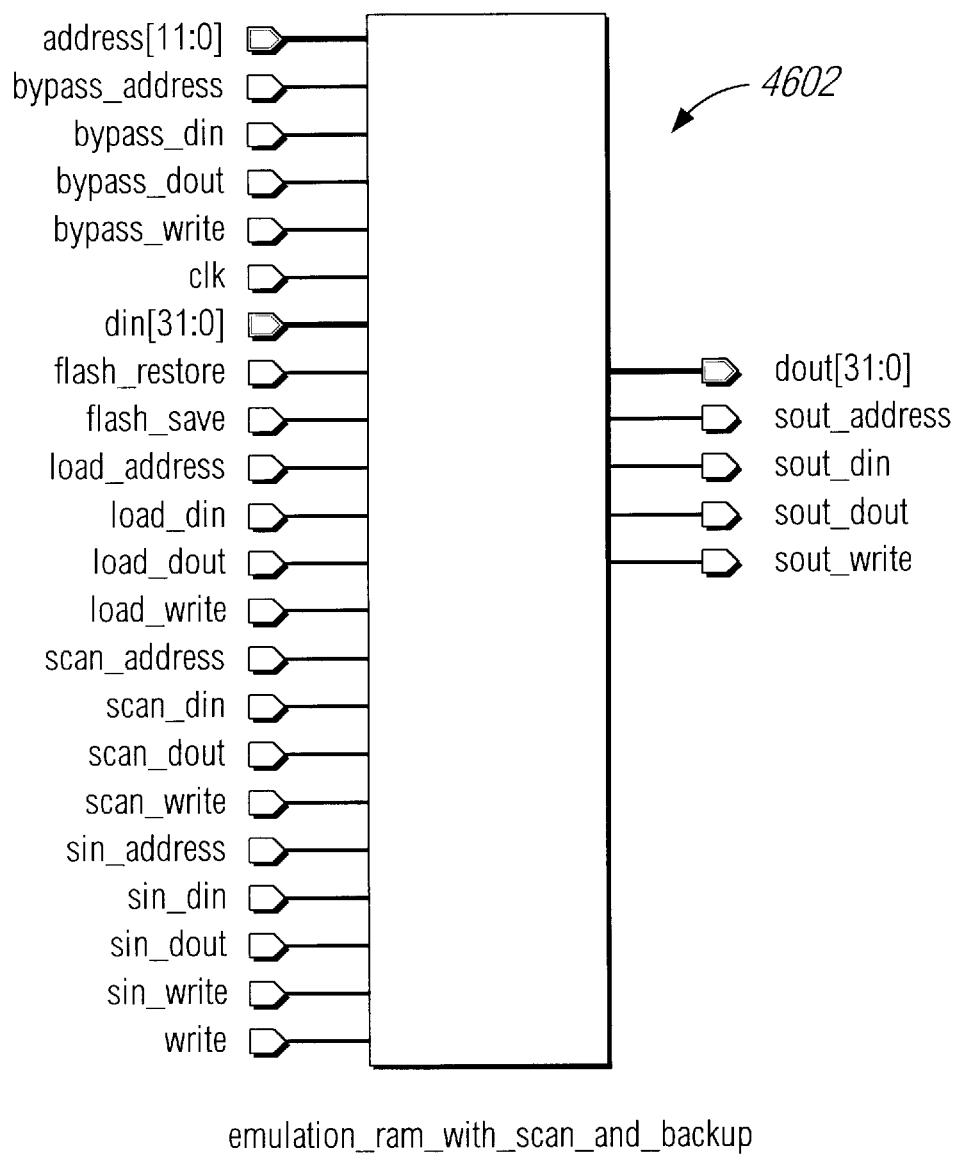
FIG. 46 is a block diagram of a 4K×32 emulation memory having "checkpoint" memory locations.
Figure 47:
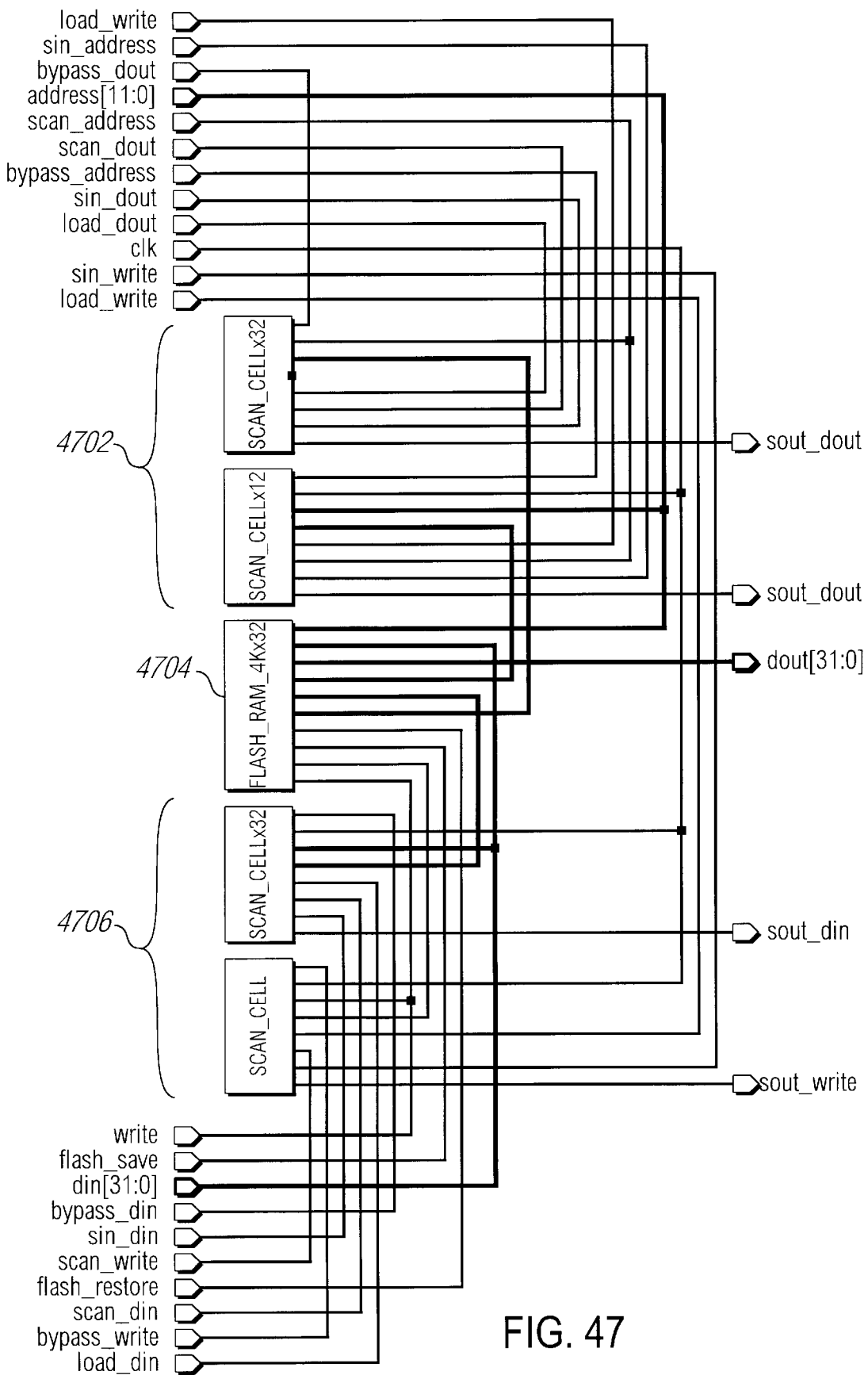
FIG. 47 is a diagram showing various details of the emulation memory of FIG. 47.

FIG. 46 is a block diagram of a 4K×32 emulation memory 4602 having "checkpoint" memory locations analogous to "checkpoint" registers 189 of FIG. 26. FIG. 47 is a diagram showing various details of the emulation memory 4602. As shown in FIG. 47, the emulation memory includes a first plurality of scan cells 4702, a 4k×32 RAM 4704 (which also contains a 4k×32 checkpoint RAM), and a second plurality of scan cells 4706.

A preferred embodiment of the present invention includes separate scan-in and scan-out lines for the shift/shadow registers and the memory. Another preferred embodiment includes a single scan-in and scan-out line for the entire system. The emulation memory circuitry provides an efficient way for the values generated from the HLUs to be stored and used in addressing the emulation memory.

Figure 50:
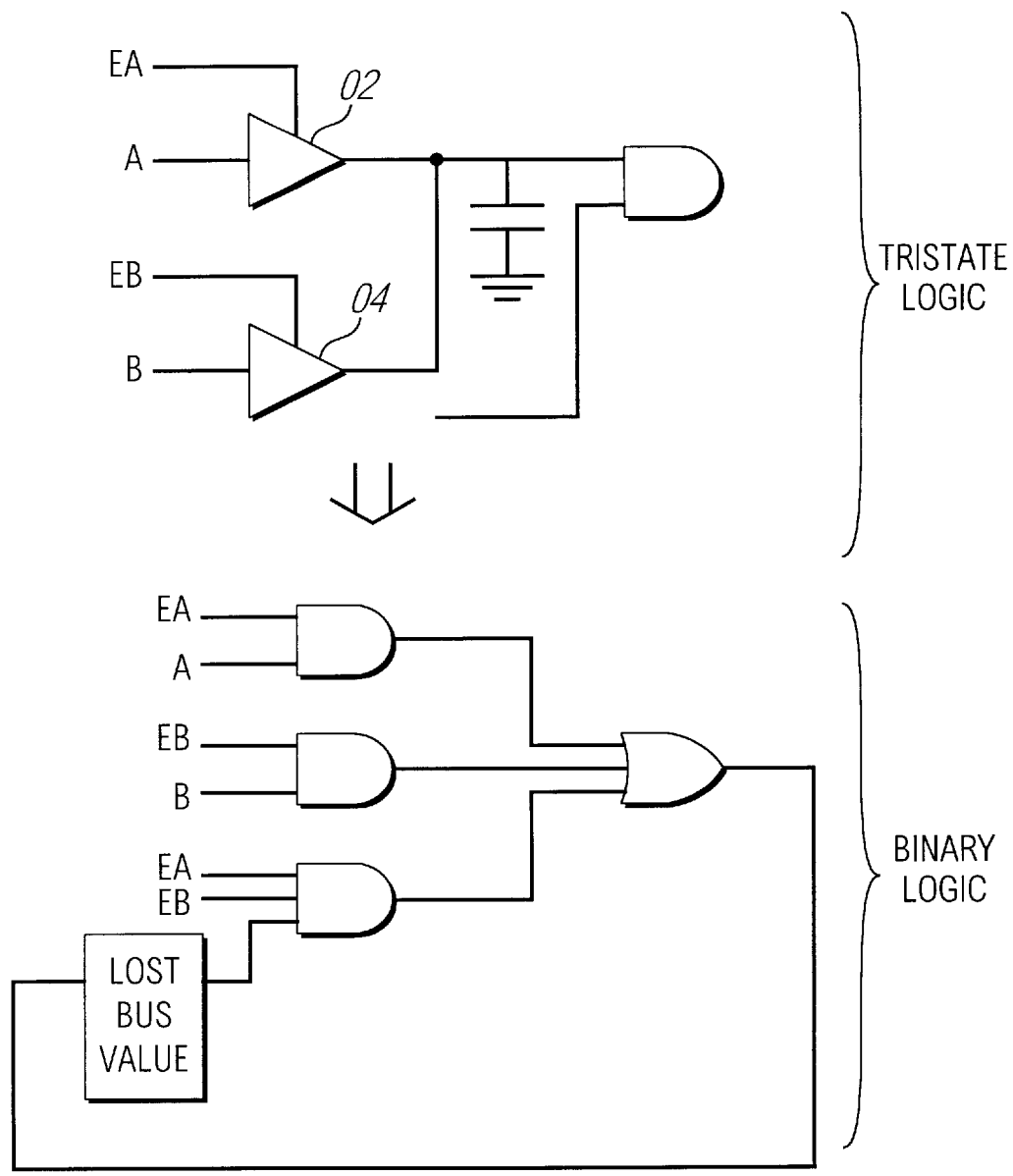
FIG. 50 is an example of how a retained bus in a design to be emulated is implemented in the emulator of the present invention.

FIG. 50 is an example of how a retained bus in a design to be emulated is implemented in the emulator of the present invention. A retained bus is a bus that holds its current value until another bus driver changes the current value. A retained bus represents a state value in a circuit and therefore needs to be checkpointed. As is shown in the Figure, the compiler of the present invention converts the tri-state elements 5002, 5004 to binary logic elements. The last output of the binary circuit is retained in a register of the emulator. The register value will be stored in one of the 256 shift/shadow register pairs, depending on the actions of the compiler when it compiles the circuit. Thus, when registers are checkpointed as described above, the contents of a retained bus in the circuit being emulated is also checkpointed.

Figure 51:
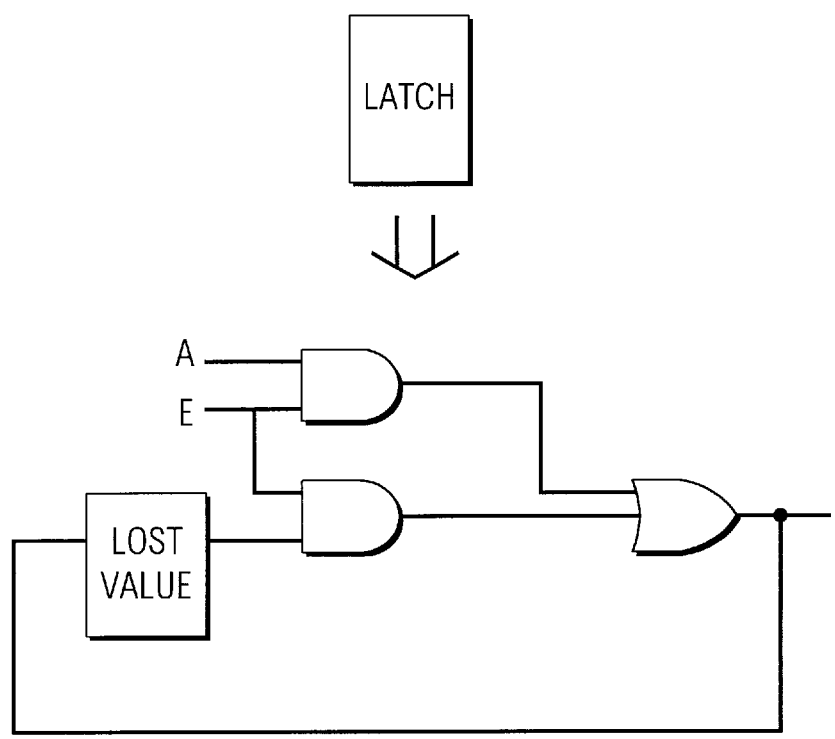
FIG. 51 is an example of how a latch in a design to be emulated is implemented in the emulator of the present invention.

FIG. 51 is an example of how a latch in a design to be emulated is implemented in the emulator of the present invention. A latch is a circuit element that is not edge triggered in accordance with a clock, but that can change value at any point in a timing cycle. A latch also represents a state value in a circuit and therefore needs to be checkpointed. As is shown in the Figure, the compiler of the present invention converts latches to binary logic elements. The last output of the binary circuit representing the state of the latch is retained in a register. This register value will be stored in one of the 256 shift/shadow register pairs, depending on the actions of the compiler when it compiles the circuit. Thus, when registers are checkpointed as described above, the contents of a latch in the circuit being emulated is also checkpointed.

FIG. 52 is an example of a format expected by a simulator interfacing with an emulator according to the present invention. This format is shown for the purpose of example only and any output format expected by a simulator can be used in conjunction with the present invention. State values, registers, latches, retained busses, and memory of the emulator correspond to memory locations in the simulator. The format of FIG. 52 is one format expected by Synopsys's Cyclone Simulator.

In the format of FIG. 52, a first line 5202 specifies the radix (hexadecimal, octal, or binary) used to represent addresses and data values, respectively. The default preferably is hexadecimal. Each succeeding line has a start address and an optional end address, followed by one or more data values. If the line does not specify enough values for the address range, the last value preferably is stored in the remaining addresses. Any line beginning with a pound sign ("#") is a comment and is ignored.

FIG. 53 shows an example of data using the format of FIG. 52. In the example, the value a (10 hexadecimal) is stored in each of the first four address. A value of 0 is stored at addresses 4 through 7. A value of 4 is stored at address 8 and the specified values are stored at addresses 9 through f. In the described embodiment, the simulator "maps" state values such as register values, latches, retained values, and memory values to a memory space in the simulator.

Figure 54:
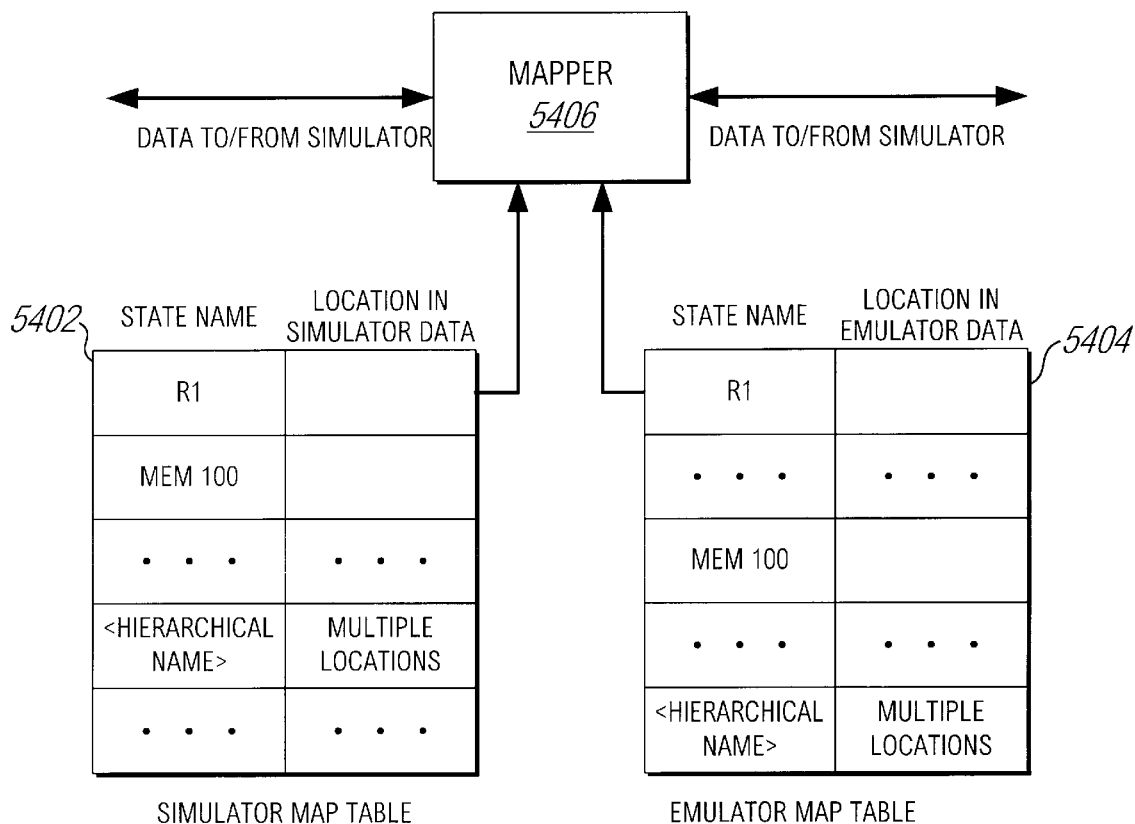
FIG. 54 shows an example of an apparatus for converting between an output format of an emulator and an input method of a simulator and vice versa.

FIG. 54 shows an example of an apparatus for converting between an output format of an emulator and an input method of a simulator and viceversa. In the described embodiment, the simulator uses the format of FIG. 52 and the emulator uses a format of a "raw" bit stream that is one bit wide. The emulator bit stream is output on a scan_out line from one or both or the registers and memory of the emulator. The apparatus of FIG. 54 can be implemented, for example, on a data processing system having a memory and a CPU and connected to I/O ports of the simulator and emulator or stored in firmware in such a system. Alternatively, one or both of the simulator and emulator can contain hardware, software, or firmware implementing the portions of FIG. 55 that convert its output data into a form usable by the other system (or that receive input from the other system and convert that data into a usable format).

FIG. 54 shows two mapping tables 5402 and 5404. Both tables are preferably stored in a memory in some other suitable storage medium. It should be understood that the tables of FIG. 54 are only an example of how such mapping data could be stored. Each entry of table 5402 includes a state name and a location in the simulator input/output where that state is located. For example, register R1 is stored at a corresponding memory location in data input to or output from the simulator. Similarly, memory location 100 is stored at a specific memory location in the simulator. Table 5402 can also name states according to a higher level hierarchical name, such as the name of a sub-component of a design, instead of naming only low-level states. The table can also reference other files, data or tables that contain a description of all or part of the design.

Each entry of table 5404 includes a state name and a location in the emulator input/output stream where that state is located (e.g., a bit number such as "the 60th bit". For example, register R1 is located in a corresponding bit location in the scan chain input to or output from the emulator. Similarly, memory location 100 (one bit) is located at a specific bit location the simulator data stream. Table 5402 can also name states according to a higher level hierarchical names as described above. Tables 5402 and 5404 are input to a mapper element 5406, which is described below.

Figure 55A:
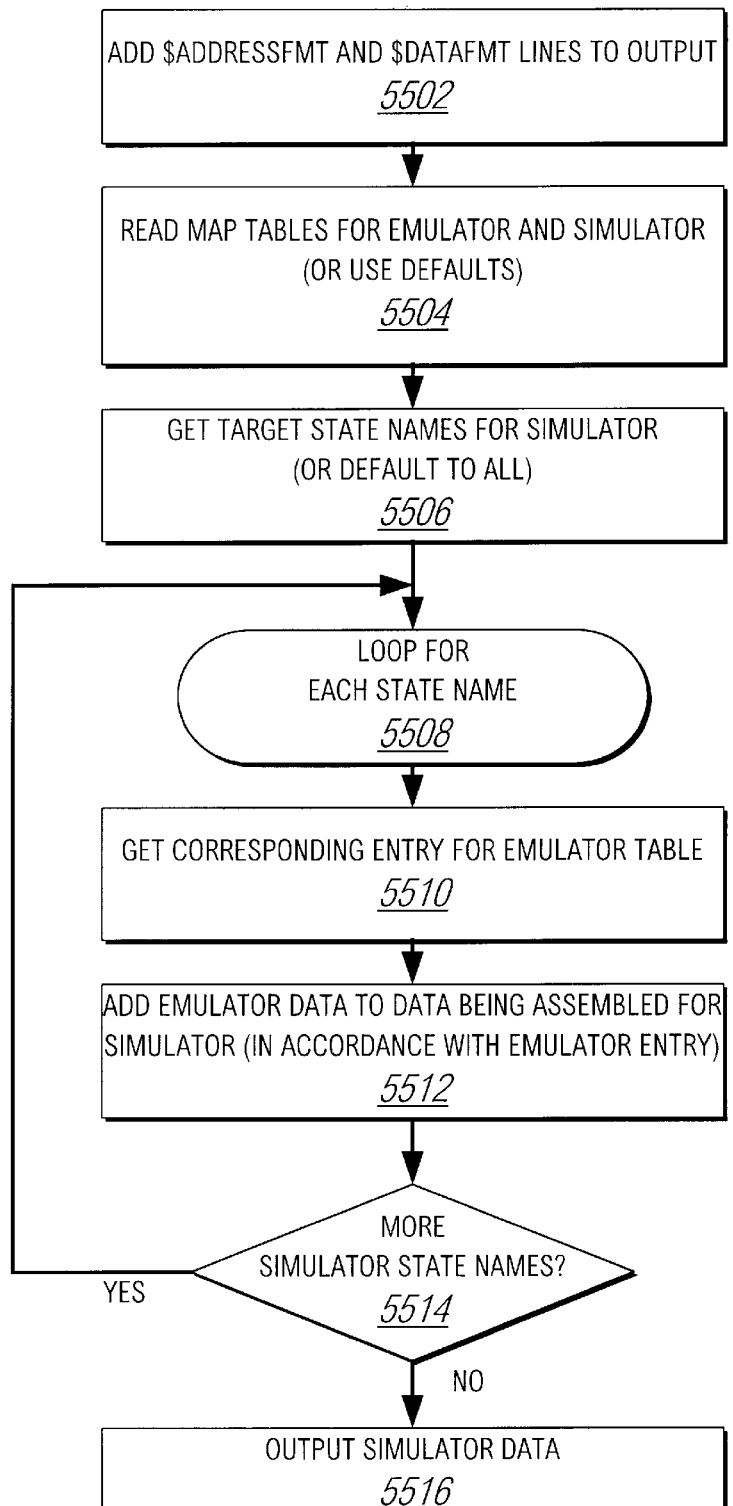
FIGS. 55(a) and 55(b) are flow charts showing an example of a method for converting between an output format of an emulator and an input method of a simulator and vice versa.
Figure 55B:
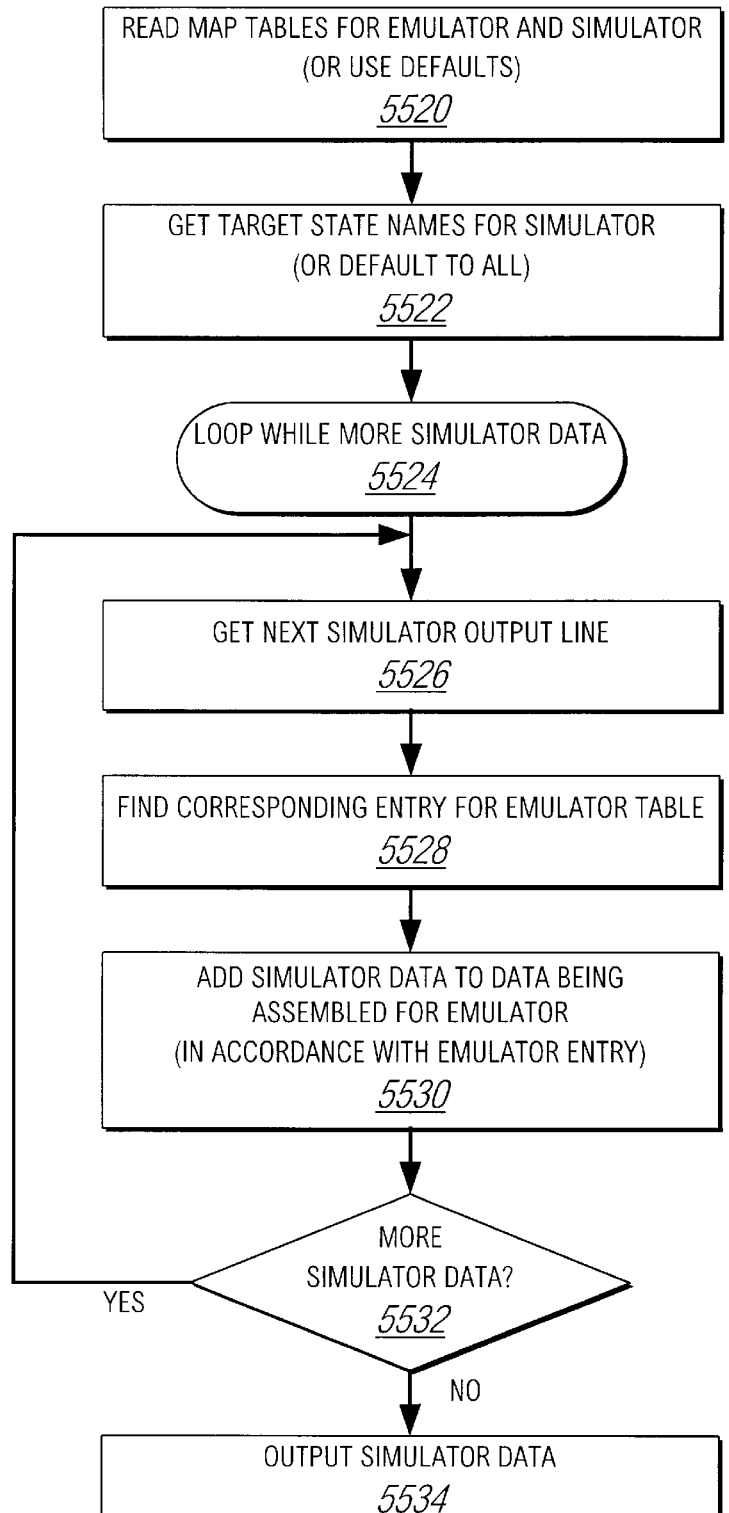

FIGS. 55(*a*) and 55(*b*) are flow charts showing an example of a method for converting between an output format of an emulator and an input method of a simulator and vice versa. This method is preferably performed by mapper element 5406 of FIG. 54. FIG. 55(*a*) shows conversion of emulator data to simulator data. In this example, it is assumed that the emulator data is all read first and then certain emulator data is output to the simulator in accordance with target state names of the simulator read in step 5506. After the simulator data is assembled in successive steps 5512, it is output to the simulator in step 5516. The mapping between the bit order of the emulator and the memory locations of the simulator is performed in accordance with the mapping tables.

FIG. 55(*b*) shows conversion of simulator data to emulator data. In this example, it is assumed that the simulator data is being read in one line at a time. After all the data has been read, certain simulator data is output to the emulator in accordance with target state names of the emulator simulator read in step 5522. After the emulator data is assembled in successive steps 5530, it is output to the emulator in step 5534. The mapping between the bit order of the emulator and the memory locations of the simulator is performed in accordance with the mapping tables. It should be understood that either the sequential reading method or the method of reading all input data before converting could be used in either of FIGS. 55(*a*) or 55(*b*).

Figure 56A:
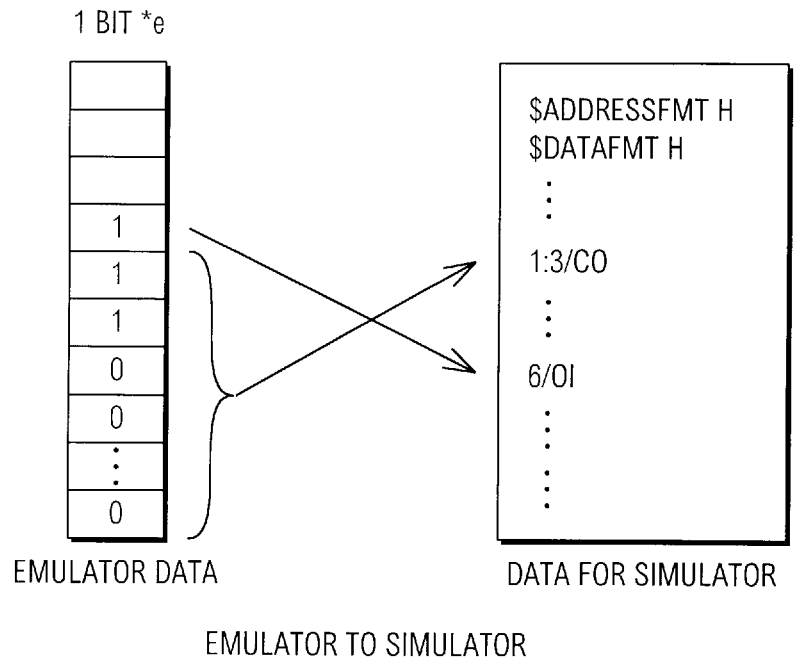
FIGS. 56(a) and 56(b) show respective examples of converting between an output format of an emulator and an input method of a simulator and vice versa.
Figure 56B:
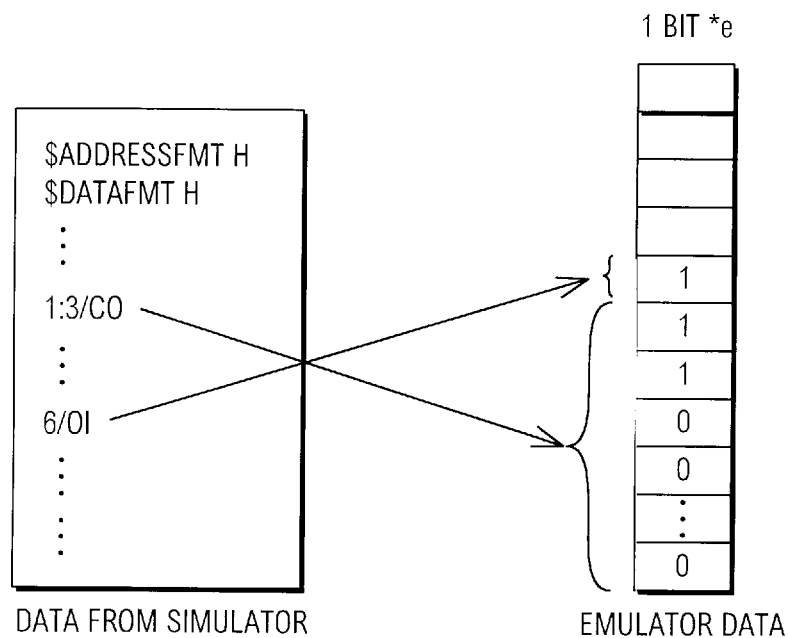

FIGS. 56(*a*) and 56(*b*) show respective examples of converting between an output format of an emulator and an input method of a simulator and vice versa. Note that one-bit emulator data may be converted to multi-bit simulator data and vice versa. In the described embodiment, mapper 5406 automatically pads with zeroes or divides bytes of data into individual bits as needed.

Although a preferred embodiment of an emulator has been described herein, it will be understood that the present invention can convert data provided by and required by various types of simulators and emulators. For example, if the emulator herein were implemented using FPGAs, such an emulator would still be capable of producing an output that could be mapped to an input format used by a simulator. Thus, the present invention can be used with a emulator implemented in, for example, FPGA technology, in any emulator using programmable chips that implement logic, or in any emulator using reconfigurable logic chips.

Other embodiments will be apparent to those skilled in the art from consideration of the specification and practice of the invention disclosed herein. It is intended that the specification and examples be considered as exemplary only, with a true scope of the invention being indicated by the following claims.

What is claimed is:

1. An apparatus for emulating a circuit in real-time, the apparatus including a logic processor for solving equations to emulate the circuit design, wherein the logic processor has logic processor inputs and logic processor outputs, comprising:

a first selector having first selector inputs and first selector outputs, wherein one or more outputs from the logic processor are coupled to the first selector inputs, wherein the first selector selects a subset of signals at the first selector inputs and applies the selected signals to the first selector outputs;

a register having register inputs and register outputs, wherein the register inputs are coupled to the outputs of the first selector, wherein the register stores the signals received from the first selector;

a second selector having second selector inputs and second selector outputs, wherein the second selector inputs are coupled to the register outputs for selectively applying the register outputs to the second selector outputs;

wherein the inputs of the logic processor are coupled to the output of the second selector; and an input line, having a first state indicating that the emulator is in SCAN mode;

an output portion, coupled to the register and the input line, for outputting the contents of the register when input line enters the first state.

2. The apparatus of claim 1, further comprising:

a memory coupled to the logic processor; and an output portion, coupled to the memory and the input line, for outputting the contents of the memory when the input line enters the first state.

* * * * *